United States Patent
Honda et al.

(10) Patent No.: US 11,056,600 B2
(45) Date of Patent: Jul. 6, 2021

(54) PHOTOELECTRIC CONVERSION ELEMENT, PHOTOELECTRIC CONVERSION ELEMENT MODULE, ELECTRONIC DEVICE, AND POWER SUPPLY MODULE

(71) Applicants: Tetsuya Honda, Shizuoka (JP); Masana Shiba, Shizuoka (JP); Yuuji Tanaka, Shizuoka (JP); Nozomu Tamoto, Shizuoka (JP); Tamotsu Horiuchi, Shizuoka (JP)

(72) Inventors: Tetsuya Honda, Shizuoka (JP); Masana Shiba, Shizuoka (JP); Yuuji Tanaka, Shizuoka (JP); Nozomu Tamoto, Shizuoka (JP); Tamotsu Horiuchi, Shizuoka (JP)

(73) Assignee: Ricoh Company, Ltd., Tokyo (JP)

( * ) Notice: Subject to any disclaimer, the term of this patent is extended or adjusted under 35 U.S.C. 154(b) by 43 days.

(21) Appl. No.: 16/352,361

(22) Filed: Mar. 13, 2019

(65) Prior Publication Data
US 2019/0305168 A1 Oct. 3, 2019

(30) Foreign Application Priority Data
Mar. 30, 2018 (JP) .............................. JP2018-069502
Jan. 21, 2019 (JP) .............................. JP2019-007583

(51) Int. Cl.
*H01L 31/06* (2012.01)
*H01L 51/42* (2006.01)
(Continued)

(52) U.S. Cl.
CPC ........... *H01L 31/06* (2013.01); *H01G 9/2004* (2013.01); *H01L 51/0067* (2013.01);
(Continued)

(58) Field of Classification Search
CPC . H01L 51/4226; H01L 51/422; H01L 51/445; H01L 51/442; H01L 51/4213;
(Continued)

(56) References Cited

U.S. PATENT DOCUMENTS 9,318,270 B2 4/2016 Horiuchi et al.
9,373,450 B2 6/2016 Arai et al.
(Continued)

FOREIGN PATENT DOCUMENTS

EP 3 113 240 A1 1/2017
JP 2014-241243 12/2014
(Continued)

OTHER PUBLICATIONS

Extended European Search Report dated Aug. 29, 2019, in Patent Application No. 19161925.3, 8 pages.

*Primary Examiner* — Andrew J Golden
(74) *Attorney, Agent, or Firm* — Oblon, McClelland, Maier & Neustadt, L.L.P.

(57) ABSTRACT

Provided is a photoelectric conversion element including a first electrode, an electron-transporting layer, a hole-transporting layer, and a second electrode, wherein the hole-transporting layer and the second electrode are in contact with each other, and the hole-transporting layer satisfies the following formula:

$$0\% < Rc(50) \leq 0.75\%$$

where an average thickness of the hole-transporting layer is determined as X (nm), and Rc(50) is a ratio of an area of projected parts that are projected from a standard line towards the second electrode, where the standard line is present at a position that is away, by X+50 (nm), from an
(Continued)

opposite surface of the hole-transporting layer to a surface of the hole-transporting layer in contact with the second electrode.

20 Claims, 10 Drawing Sheets

(51) Int. Cl.
    *H01L 51/44*     (2006.01)
    *H01G 9/20*     (2006.01)
    *H01L 51/00*     (2006.01)

(52) U.S. Cl.
    CPC .......... *H01L 51/4213* (2013.01); *H01L 51/44* (2013.01); *H01L 51/441* (2013.01); *H01L 51/0003* (2013.01); *H01L 51/4226* (2013.01); *H01L 2251/306* (2013.01); *H01L 2251/558* (2013.01)

(58) Field of Classification Search
    CPC ....... H01L 51/44; H01L 51/441; H01L 31/06; H01G 9/2009; H01G 9/2004; H01G 9/2059
    USPC .................................................. 136/243–265
    See application file for complete search history.

(56) References Cited

U.S. PATENT DOCUMENTS

| | | |
|---|---|---|
| 9,378,899 B2 | 6/2016 | Arai et al. |
| 9,640,330 B2 | 5/2017 | Tanaka et al. |
| 2005/0238799 A1* | 10/2005 | Seki .................... H01L 51/5012 427/66 |
| 2009/0160396 A1* | 6/2009 | Shyu ........................ H01G 9/20 320/101 |
| 2012/0125414 A1 | 5/2012 | Kamezaki et al. |
| 2016/0071655 A1 | 3/2016 | Li et al. |
| 2016/0276609 A1 | 9/2016 | Horiuchi et al. |
| 2016/0285021 A1 | 9/2016 | Yang et al. |
| 2017/0069431 A1 | 3/2017 | Tanaka et al. |
| 2017/0092433 A1 | 3/2017 | Kanei et al. |
| 2017/0222150 A1 | 8/2017 | Arai et al. |
| 2017/0243698 A1 | 8/2017 | Kanei et al. |
| 2017/0250030 A1* | 8/2017 | Druffel ............... H01L 51/4226 |
| 2017/0358399 A1 | 12/2017 | Matsuyama et al. |
| 2018/0053863 A1 | 2/2018 | Tanaka et al. |
| 2018/0197688 A1 | 7/2018 | Horiuchi et al. |
| 2018/0198083 A1 | 7/2018 | Tanaka et al. |
| 2018/0330890 A1 | 11/2018 | Tanaka et al. |
| 2019/0105812 A1 | 4/2019 | Qi et al. |

FOREIGN PATENT DOCUMENTS

| | | |
|---|---|---|
| JP | 2015-060897 | 3/2015 |
| JP | 2017-034089 | 2/2017 |
| WO | WO2015/125587 | 8/2015 |
| WO | WO 2017/213016 A1 | 12/2017 |
| WO | WO 2017/2130116 A1 | 12/2017 |
| WO | WO 2019/070977 A1 | 4/2019 |

* cited by examiner

US 11,056,600 B2

PHOTOELECTRIC CONVERSION ELEMENT, PHOTOELECTRIC CONVERSION ELEMENT MODULE, ELECTRONIC DEVICE, AND POWER SUPPLY MODULE

CROSS-REFERENCE TO RELATED APPLICATIONS

The present application claims priority under 35 U.S.C. § 119 to Japanese Patent Application No. 2018-069502 filed Mar. 30, 2018 and Japanese Patent Application No. 2019-007583 filed Jan. 21, 2019. The contents of which are incorporated herein by reference in their entirety.

BACKGROUND OF THE INVENTION

Field of the Invention

The present disclosure relates to a photoelectric conversion element, a photoelectric conversion element module, an electronic device, and a power supply module.

Description of the Related Art

In recent years, solar cells have become more and more important as alternative energy for fossil fuels and as a measure against global warming. Various solar cells (photoelectric conversion element modules) have been developed.

Among them, numerous solid dye-sensitized solar cells each using a solid hole-transporting layer have been reported. For example, materials of the solid hole-transporting layer are roughly classified into 1) a material using an inorganic semiconductor, 2) a material using a low molecular-weight organic hole-transporting material, and 3) a material using a conductive polymer.

Since current leakage occurs in such a solid dye-sensitized solar cell when light is converted into electricity, various counter measures have been reported. For example, proposed is a solar cell including a transparent conductive film as a first electrode, a porous semiconductor layer as an electron-transporting layer disposed on the transparent conductive film and configured to release electrons as light receives, a titanium oxide film formed on the porous semiconductor layer, a light electrode disposed on the titanium oxide film and including a dye layer, a solid hole-transporting layer disposed next to the light electrode, and a counter electrode as a second electrode, where occurrence of current leakage between the electron-transporting layer and the hole-transporting layer is prevented by forming the titanium oxide film on the electron-transporting layer, to thereby prevent reduction in output. Moreover, proposed for reducing current leakage is to dispose a dense layer of titanium oxide between a transparent conductive film and an electron-transporting layer using a solution including a titanium compound (see, for example, Japanese Unexamined Patent Application Publication No. 2014-241243).

SUMMARY OF THE INVENTION

According to one aspect of the present disclosure, photoelectric conversion element includes a first electrode, an electron-transporting layer, a hole-transporting layer, and a second electrode. The hole-transporting layer and the second electrode are in contact with each other. The hole-transporting layer satisfies the following formula:

0%<$Rc(50)$≤0.75% where an average thickness of the hole-transporting layer is determined as X (nm), and Rc(50) is a ratio of an area of projected parts that are projected from a standard line towards the second electrode, where the standard line is present at a position that is away, by X+50 (nm), from an opposite surface of the hole-transporting layer to a surface of the hole-transporting layer in contact with the second electrode.

DESCRIPTION OF THE EMBODIMENTS (Photoelectric Conversion Element)

A photoelectric conversion element of the present disclosure includes a first electrode, an electron-transporting layer, a hole-transporting layer, and a second electrode, where the hole-transporting layer and the second electrode are in contact with each other. Moreover, the photoelectric conversion element of the present disclosure satisfies the following formula:

$$0\% < Rc(50) \leq 0.75\%$$

where an average thickness of the hole-transporting layer is determined as X (nm), and Rc(50) is a ratio of an area of projected parts that are projected from a standard line towards the second electrode, where the standard line is present at a position that is away, by X+50 (nm), from an opposite surface of the hole-transporting layer to a surface of the hole-transporting layer in contact with the second electrode.

The present disclosure has an object to provide a photoelectric conversion element that can suppress reduction in output with low illuminance light before and after being exposed to high illuminance light.

The present disclosure can provide a photoelectric conversion element that can suppress reduction in output with low illuminance light before and after being exposed to high illuminance light.

The photoelectric conversion element of the present disclosure has accomplished based on the following insights. That is, a photoelectric conversion element known in the art has a problem that current leakage caused between an electron-transporting layer and a hole-transporting layer increases when light of low illuminance is applied after applying light of high illuminance, and therefore a photoelectric conversion efficiency is degraded.

The present inventors have focused on a structure of the hole-transporting layer or counter electrode, and has found that the above-mentioned problem can be solved by reducing an area projected parts that are higher than the predetermined height occupying in the surface of the hole-transporting layer, not reducing roughness of the surface of the hole-transporting layer adjacent to the counter electrode. Specifically, by reducing the area the projected parts having the certain height occupying in the surface of the hole-transporting layer, the photoelectric conversion element of the present disclosure can maintain high output without current leakage even when light of low illuminance is applied after being exposed to a high illuminance environment. The reasons why such an effect can be obtained are assumed as follows.

Figure 1:
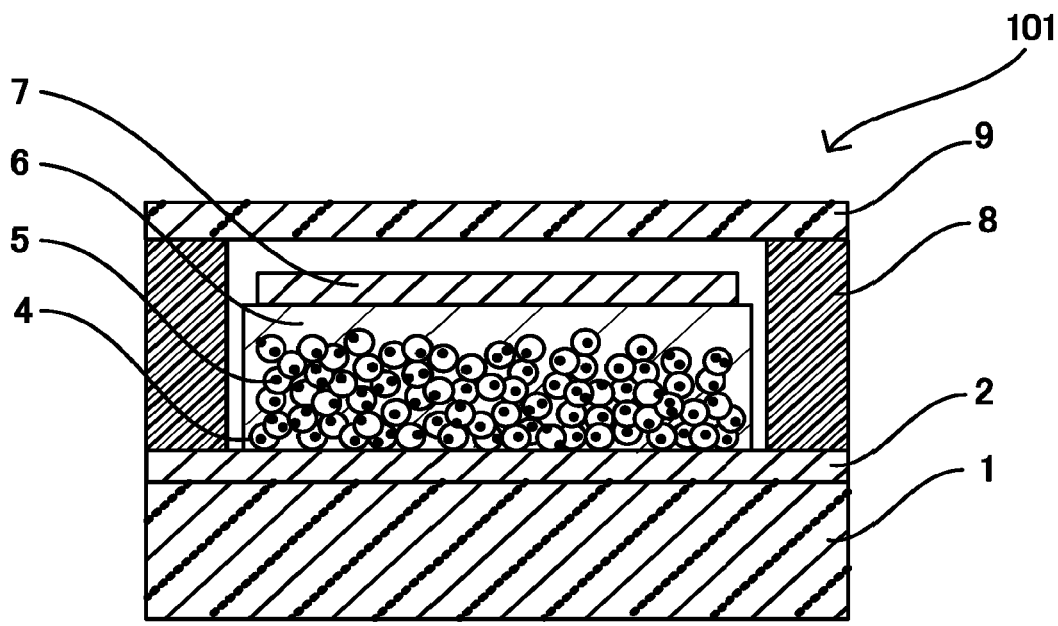
FIG. 1 is a schematic view illustrating an example of a photoelectric conversion element of the present disclosure.

FIG. 1 is a schematic view illustrating an example of the photoelectric conversion element of the present disclosure.

As illustrated in FIG. 1, a first electrode 2 is formed on a first substrate 1 in the photoelectric conversion element 101. An electron-transporting layer 4 is formed on the first electrode 2, and a photosensitizing compound 5 is adsorbed on a surface of an electron-transporting material constituting the electron-transporting layer 4. A hole-transporting layer 6 is formed at an upper part and inner part of the electron-transporting layer 4, and a second electrode 7 is formed on the hole-transporting layer 6. A second substrate 9 is disposed above the second electrode 7, and the second substrate 9 is fixed with a sealing member 8 disposed between the second substrate 9 and the first electrode 2.

Figure 2:
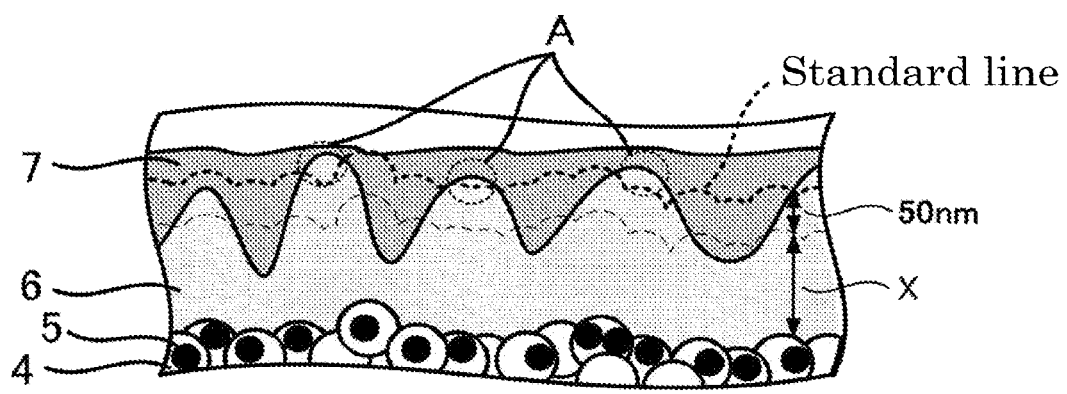
FIG. 2 is a schematic enlarged view illustrating an example of interfaces of a second electrode, a hole-transporting layer, and an electron-transporting layer in a photoelectric conversion element of related art.

A schematic view where an electron-transporting layer 4, a hole-transporting layer 6, and a second electrode 7 in a photoelectric conversion element known in the art are enlarged is illustrated in FIG. 2.

When an average thickness of the hole-transporting layer 6 is determined as X (nm) (one dot-dashed line in FIG. 2), as illustrated in FIG. 2, a standard line (dashed line in FIG. 2) is drawn. The standard line is positioned at a distance that is away, by X+50 (nm), from a surface of the hole-transporting layer 6 that is opposite to a surface of the hole-transporting layer 6 in contact with the second electrode 7. When a ratio of an area (area when the portions indicated with A in FIG. 2 are planar viewed) projected parts occupying is determined as Rc(50) in the hole-transporting layer 6, where the projected parts are projected from the standard line towards the side of the second electrode 7, current leakage tends to occur if Rc(50) is high. It is assumed that a layer thickness of the second electrode 7 present just above the produced parts of the hole-transporting layer 6 becomes thin and resistance is locally reduced when heights of projected parts on the surface of the hole-transporting layer 6 are sufficiently high relative to the average thickness of the second electrode 7, and therefore electric current is relatively concentrated at an interface between the hole-transporting layer 6 and the second electrode 7 at the time of light irradiation to become a point of leakage.

Figure 3:
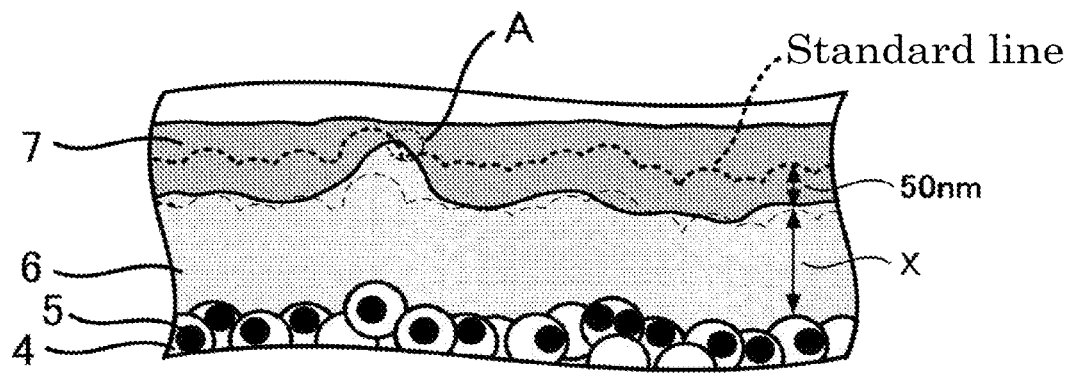
FIG. 3 is a schematic enlarged view illustrating an example of interfaces of a second electrode, a hole-transporting layer, and an electron-transporting layer in the photoelectric conversion element of the present disclosure.

FIG. 3 is a schematic enlarged view illustrating an example of interfaces of the second electrode, the hole-transporting layer, and the electron-transporting layer of the photoelectric conversion element of the present disclosure.

When an area the projected parts occupying on the surface of the hole-transporting layer 6, as illustrated in FIG. 3, the number of points electric current is relatively concentrated becomes small and therefore occurrence of electric current leakage can be suppressed.

As a range of Rc(50), the following formula 0.00%<Rc(50)≤0.75% is satisfied. The range thereof is preferably 0.00%<Rc(50)≤0.50%. When Rc(50) is greater than 0.75%, leakage of electric current cannot be ignored and durability of the photoelectric conversion element decreases with high illuminance. When Rc(50) is within the preferable range, moreover, reduction in output with low illuminance light before and after being exposed to high illuminance light can be suppressed.

The above-described leakage of electric current due to the projected parts does not appear significantly on measurements with high illuminance, but becomes particularly significant when the photoelectric conversion element is evaluated with low illuminance light, and causes reduction in output.

One of the grounds of the above-mentioned assumption is that an amount of leakage of electric current is influenced by an average thickness of the second electrode.

Therefore, it is ideal that the number of the projected parts of the hole-transporting layer each having a height of ½ or higher than the average thickness of the second electrode is small. However, the number of the projected parts in a solid dye-sensitized solar cell cannot be zero unlike a liquid-type solar cell because a solid hole-transporting layer is applied on a porous metal oxide semiconductor. The porous metal semiconductor is designed to be porous in view of securing a surface area onto which a dye is deposited and securing impregnation of the hole-transporting layer to be applied. A surface of the porous metal semiconductor becomes rough to a certain degree. As the surface of the porous metal semiconductor becomes rougher, heights of the projected parts of the adjacent hole-transporting layer become high and the area thereof also increases.

Leakage of electric current significantly appears when the average thickness of the second electrode is thin relative to the heights of the projected parts on the surface of the hole-transporting layer. Therefore, the lower limit of the average thickness of the second electrode is preferably 25 nm or greater, and more preferably 50 nm or greater. Meanwhile, the thickness of the second electrode is preferably thin in view of the cost of the material. Therefore, the upper limit of the average thickness of the second electrode is preferably 300 nm or less, and more preferably 200 nm or less.

<Measuring Method of Layer Thickness (Average Thickness)>

A measuring method of a layer thickness of the hole-transporting layer and a layer thickness of the second electrode is not particularly limited. As the measuring method, any of methods known in the art can be used. Examples of the measuring method include a method using a step gauge, a method using a coherence scanning interference microscope, and cross-section observation under SEM. When a layer thickness of the hole-transporting layer 6 of the photoelectric conversion element illustrated in FIG. 1 is measured by means of a coherence scanning interference microscope (VS1500, available from Hitachi High-Tech Science Corporation), specifically, part of the electron-transporting layer 4 one layer below the hole-transporting layer 6 is exposed and a step there of may be measured, or a layer thickness of the electron-transporting layer 4 may be measured from a step between the electron-transporting layer 4 and the first substrate 1 and a step between the hole-transporting layer 6 and the first substrate 1. In the former case, examples of a method for exposing part of the electron-transporting layer 4 include a method where a solvent for dissolving the hole-transporting layer 6, such as tetrahydrofuran, is dripped. With adjusting a field of view in a manner that the electron-transporting layer 4 that is one layer below the hole-transporting layer 6 comes into the same captured image with the hole-transporting layer 6, moreover, an image can be taken, for example, under the following measuring conditions. Then, an average thickness X of the hole-transporting layer 6 can be measured by an average step analysis.

[Measuring Conditions of Layer Thickness]
Measuring mode: WAVE mode
Magnification of objective lens: 2.5×
Wavelength filter: 530 nm White
Observation range: 1,900 µm×1,400 µm
Number of pixels: 640 pix×480 pix
<Determination Method of Rc(50)>

For example, Rc(50) can be determined in the following manner.

A surface configuration of the hole-transporting layer is planar observed by means of a coherence scanning interference microscope (VS1500, available from Hitachi High-Tech Science Corporation). Next, a total cross-sectional area of the projected parts having the height of X+50 (nm) or greater from the surface of the hole-transporting layer 6 that is opposite to the surface thereof in contact with the second electrode 7 is determined by particle analysis. The obtained total cross-sectional area is divided with the area of the observed region. Then, an average value of the values obtained from, for example, three fields of view, is calculated to determine Rc(50).

[Measuring Conditions of Rc(50)]
Measuring mode: WAVE mode
Magnification of objective lens: 10×
Wavelength filter: 530 nm White
Observation range: 470 nm×350 nm
Number of pixels: 640 pix×480 pix
<Photoelectric Conversion Element>

The photoelectric conversion element is an element that is capable of converting photoenergy to electric energy, and is applied for solar batteries and photo diodes. The photoelectric conversion element and photoelectric conversion element module of the present disclosure can high power generation performance not only with sun light but also with light of lighting equipment used indoor, such as LED and fluorescent lamps.

The photoelectric conversion element includes a first electrode, an electron-transporting layer, a hole-transporting layer, and a second electrode. The photoelectric conversion element may further include other members.

«First Electrode»

A shape and size of the first electrode are not particularly limited and may be appropriately selected depending on the intended purpose.

A structure of the first electrode is not particularly limited and may be appropriately selected depending on the intended purpose. The structure of the first electrode may be a single layer structure or a structure where a plurality of materials are laminated.

A material of the first electrode is not particularly limited and may be appropriately selected depending on the intended purpose, as long as the material is a material having transparency to visible light and conductivity. Examples of the material include transparent conductive metal oxide, carbon, and metal.

Examples of the transparent conductive metal oxide include indium-tin oxide (referred to as "ITO" hereinafter), fluorine-doped tin oxide (referred to as "FTO" hereinafter), antimony-doped tin oxide (referred to as "ATO" hereinafter), niobium-doped tin oxide (referred to as "NTO" hereinafter), aluminium-doped zinc oxide, indium-zinc oxide, and niobium-titanium oxide.

Examples of the carbon include carbon black, carbon nanotubes, graphene, and fullerene.

Examples of the metal include gold, silver, aluminium, nickel, indium, tantalum, and titanium.

The above-listed examples may be used alone or in combination. Among the above-listed examples, transparent conductive metal oxide having high transparency is preferable, and ITO, FTO, ATO, and NTO are more preferable.

An average thickness of the first electrode is not particularly limited and may be appropriately selected depending on the intended purpose. The average thickness of the first electrode is preferably 5 nm or greater but 100 µm or less, and more preferably 50 nm or greater but 10 µm or less. In the case where a material of the first electrode is carbon or metal, the average thickness of the first electrode is preferably an average thickness with which translucency is easily obtained.

The first electrode can be formed by methods known in the art, such as sputtering, vapor deposition, and spraying.

Moreover, the first electrode is preferably formed on the first substrate. A commercial product where a first electrode is formed on a first substrate in advance and is integrated with the first substrate can be used.

Examples of the integrated commercial product include FTO coated glass, ITO coated glass, zinc oxide/aluminium coated glass, an FTO coated transparent plastic film, and an ITO coated transparent plastic film. Another examples of the integrated commercial product include a glass substrate with a transparent electrode in which tin oxide or indium oxide is doped with a cation or anion having a different atomic value, and a glass substrate with a metal electrode having a structure to pass through light, such as in the form of a mesh or stripes.

The above-listed examples may be used alone, or a mixture, or a laminate. Moreover, a metal lead wire may be used for the purpose of reducing an electric resistance value.

Examples of a material of the metal lead wire include aluminium, copper, silver, gold, platinum, and nickel.

For example, the metal lead wire is used in combination and formed on the substrate by vapor deposition, sputtering, or pressure bonding, followed by disposing a layer of ITO or FTO on the metal lead wire.

«Electron-Transporting Layer»

The electron-transporting layer is formed for the purpose of transporting electrons generated by the photosensitizing compound to the first electrode or the hole blocking layer. Therefore, the electron-transporting layer is preferably arranged adjacent to the first electrode or the hole blocking layer.

A structure of the electron-transporting layer may be a continuous single layer, or a multiple layer in which a plurality of layers are laminated.

The electron-transporting layer includes an electron-transporting material, and may further include other materials according to the necessity.

The electron-transporting material is not particularly limited and may be appropriately selected depending on the intended purpose. The electron-transporting material is preferably a semiconductor material.

It is preferable that the semiconductor material be in the shape of particles and a porous film be formed by joining the particles together. A photosensitizing compound is chemically or physically adsorbed on surfaces of the semiconductor particles constituting the porous electron-transporting layer.

The semiconductor material is not particularly limited and may be selected from materials known in the art. Examples of the semiconductor material include a single semiconductor, a compound semiconductor, and a compound having a perovskite structure.

Examples of the single semiconductor include silicon and germanium.

Examples of the compound semiconductor include chalcogenide of metal. Specific examples thereof include: oxides of titanium, tin, zinc, iron, tungsten, zirconium, hafnium, strontium, indium, cerium, yttrium, lanthanum, vanadium, niobium, and tantalum; sulfides of cadmium, zinc, lead, silver, antimony, and bismuth; selenides of cadmium and lead; and telluride of cadmium. Other examples of the compound semiconductor include: phosphides of zinc, gallium, indium, and cadmium; gallium arsenide; copper-indium-selenide; and copper-indium-sulfide.

Examples of the compound having a perovskite structure include strontium titanate, calcium titanate, sodium titanate, barium titanate, and potassium niobate.

Among the above-listed examples, oxide semiconductors are preferable, and particularly, titanium oxide, zinc oxide, tin oxide, and niobium oxide are more preferable.

The above-listed examples may be used alone or in combination. Moreover, a crystal structure of any of the above-listed semiconductors is not particularly limited and may be appropriately selected depending on the intended purpose. The crystal structure thereof may be a single crystal, polycrystalline, or amorphous.

A number average particle diameter of primary particles of the semiconductor material is not particularly limited and may be appropriately selected depending on the intended purpose. The number average particle diameter thereof is preferably 1 nm or greater but 100 nm or less, and more preferably 5 nm or greater but 50 nm or less. Moreover, a semiconductor material having the lager particle size than the number average particle diameter may be mixed or laminate. Use of such a semiconductor material may improve a conversion efficiency owing to an effect of scattering incident light. In this case, the number average particle diameter is preferably 50 nm or greater but 500 nm or less.

An average thickness of the electron-transporting layer is not particularly limited and may be appropriately selected depending on the intended purpose. The average thickness of the electron-transporting layer is preferably 50 nm or greater but 100 µm or less, more preferably 100 nm or greater but 50 µm or less, and even more preferably 120 nm or greater but 10 µm or less. When the average thickness of the electron-transporting layer is within the preferable range, an amount of the photosensitizing compound per unit projected area can be sufficiently secured, a capturing rate of light can be maintained high, a diffusion length of injected electrons is not easily increased, and loss due to recombination of charge can be maintained low. Therefore, the electron-transporting layer having the average thickness falling in the preferable range is advantageous.

A production method of the electron-transporting layer is not particularly limited and may be appropriately selected depending on the intended purpose. Examples of the production method thereof include a method where a thin film is formed in vacuum, such as sputtering, and a wet film forming method. Among the above-listed example, in view of a production cost, a wet film forming method is preferable, and a method where a paste in which powder or sol of a semiconductor material is dispersed is prepared, and the paste is applied onto a first electrode serving as an electron-collecting electrode substrate or a hole blocking layer is more preferable.

The wet film forming method is not particularly limited and may be appropriately selected depending on the intended purpose. Examples of the wet film forming method include dip coating, spray coating, wire bar coating, spin coating, roller coating, blade coating, and gravure coating.

As a wet printing method, for example, various methods, such as relief printing, offset printing, gravure printing, intaglio printing, rubber plate printing, and screen printing, can be used.

Examples of a method for producing a dispersion liquid of the semiconductor material include a method where the semiconductor material is mechanically pulverized using a milling device known in the art. According to the method as mentioned, a particular semiconductor material alone or a mixture of the semiconductor material and a resin is dispersed in water or a solvent to thereby produce a dispersion liquid of the semiconductor material.

Examples of the resin include a polymer or copolymer of a vinyl compound (e.g., styrene, vinyl acetate, acrylic acid ester, and methacrylic acid ester), a silicone resin, a phenoxy resin, a polysulfone resin, a polyvinyl butyral resin, a polyvinyl formal resin, a polyester resin, a cellulose ester resin, a cellulose ether resin, a urethane resin, a phenol resin, an epoxy resin, a polycarbonate resin, a polyarylate resin, a polyamide resin, and a polyimide resin. The above-listed examples may be used alone or in combination.

Examples of the solvent include water, an alcohol solvent, a ketone solvent, an ester solvent, an ether solvent, an amide solvent, a halogenated hydrocarbon solvent, and a hydrocarbon solvent.

Examples of the alcohol solvent include methanol, ethanol, isopropyl alcohol, and alpha-terpineol.

Examples of the ketone solvent include acetone, methyl ethyl ketone, and methyl isobutyl ketone.

Examples of the ester solvent include ethyl formate, ethyl acetate, and n-butyl acetate.

Examples of the ether solvent include diethyl ether, dimethoxy ethane, tetrahydrofuran, dioxolane, and dioxane.

Examples of the amide solvent include N,N-dimethylformamide, N,N-dimethylacetamide, and N-methyl-2-pyrrolidone.

Examples of the halogenated hydrocarbon solvent include dichloromethane, chloroform, bromoform, methyl iodide, dichloroethane, tirchloroethane, trichloroethylene, chlorobenzene, o-dichlorobenzene, fluorobenzene, bromobenzene, iodobenzene, and 1-chloronaphthalene. Examples of the hydrocarbon solvent include n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene.

The above-listed examples may be used alone or in combination.

In order to prevent reaggregation of particles, acid, a surfactant, or a chelating agent may be added to a dispersion liquid including the semiconductor material or a paste including the semiconductor material obtained by a sol-gel method.

Examples of the acid include hydrochloric acid, nitric acid, and acetic acid.

Examples of the surfactant include polyoxyethylene octylphenyl ether.

Examples of the chelating agent include acetyl acetone, 2-aminoethanol, and ethylene diamine.

Moreover, it is also effective to add a thickener for the purpose of improving film forming ability.

Examples of the thickener include polyethylene glycol, polyvinyl alcohol, and ethyl cellulose.

After applying the semiconductor material, the semiconductor material may be subjected to firing, irradiation with microwaves or an electron beam, or laser beam irradiation in order to electrically contact particles of the semiconductor materials one another to improve the film strength or adhesion to the substrate. The above-listed processes may be performed alone or in combination.

In the case where the electron-transporting layer formed of the semiconductor material is fired, a firing temperature is not particularly limited and may be appropriately selected depending on the intended purpose. Since resistance of the substrate may become too high or a material may be melted when the temperature is too high, the firing temperature is preferably 30° C. or higher but 700° C. or lower, and more preferably 100° C. or higher but 600° C. or lower. Moreover, firing duration is not particularly limited and may be appropriately selected depending on the intended purpose. The firing duration is preferably 10 minutes or longer but 10 hours or shorter.

In the case where the electron-transporting layer formed of the semiconductor material is irradiated with microwaves, irradiate duration is not particularly limited and may be appropriately selected depending on the intended purpose. The irradiation duration is preferably 1 hour or shorter. In this case, irradiation may be performed from the side where the electron-transporting layer is formed, or from the side where the electron-transporting layer is not formed.

After firing the electron-transporting layer formed of the semiconductor material, for example, chemical plating using a titanium tetrachloride aqueous solution or a mixed solution with an organic solvent, or electrochemical plating using a titanium trichloride aqueous solution may be performed for the purpose of enhancing an electron injection efficiency from the below-mentioned photosensitizing compound to the semiconductor material.

The film obtained by firing the semiconductor material having a particle diameter of several tens nanometers can form a porous structure. Such a nanoporous structure has an extremely high surface area and the surface area can be represented by a roughness factor. The roughness factor is a numerical value representing an actual area of the inner side of pores relative to an area of the semiconductor particles applied onto the first substrate. Accordingly, the larger value of the roughness factor is more preferable. In view of a relationship with the average thickness of the electron-transporting layer, the roughness factor is preferably 20 or greater.

«Photosensitizing Compound»

A photosensitizing compound is adsorbed on a surface of the semiconductor material constituting the electron-transporting layer in order to further improve output or a photoelectric conversion efficiency.

The photosensitizing compound is not particularly limited and may be appropriately selected depending on the intended purpose, as long as the photosensitizing compound is a compound that is photoexcited by excitation light emitted to the photoelectric conversion element. Examples of the photosensitizing compound include compounds known in the art below. Specific examples thereof include metal complex compounds, cumarin compounds, polyene compounds, indoline compounds, thiophene compounds, cyanine dyes, merocyanine dyes, 9-arylxanthene compounds, triaryl methane compounds, phthalocyanine compounds, and porphyrin compounds.

Among the above-listed examples, a metal complex compound, a cumarin compound, a polyene compound, an indoline compound, and a thiophene compound are preferable. The compounds represented by Structural Formulae (1), (2), and (3) below available from MITSUBISHI PAPER MILLS LIMITED, and moreover a compound represented by General Formula (3) below are more preferable. The above-listed photosensitizing compounds may be used alone or in combination.

Structural Formula (1)

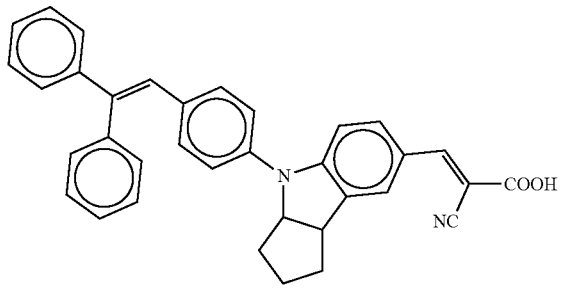

Structural Formula (2)

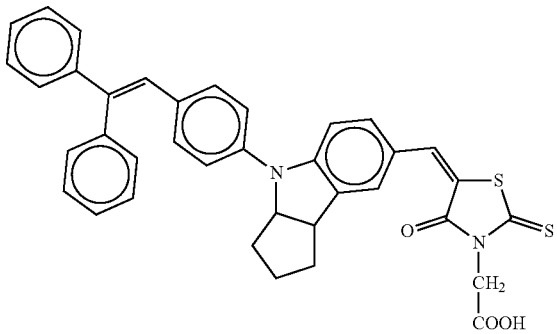

Structural Formula (3)

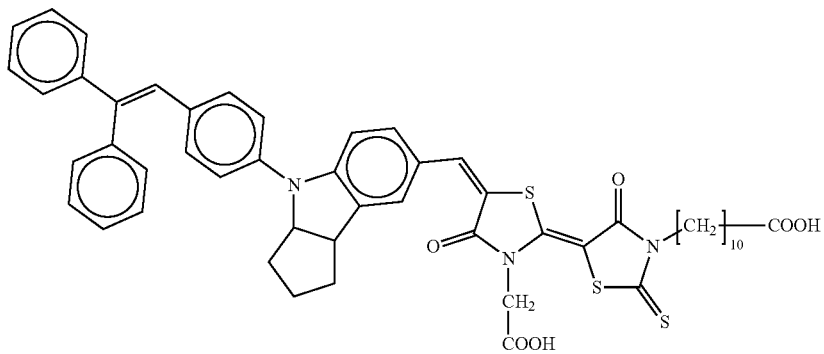

General Formula (3)

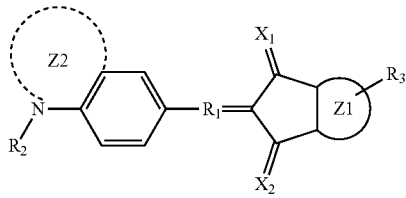

(In the formula above, $X_1$ and $X_2$ are each an oxygen atom, a sulfur atom, and a selenium atom; $R_1$ is a methine group that may have a substituent, where specific examples of the substituent include an aryl group (e.g., a phenyl group and a naphthyl group) and a hetero cycle (e.g., a thienyl group and a furyl group); $R_2$ is an alkyl group that may have a substituent, an aryl group, or a heterocydic group, where examples of the alkyl group include a methyl group, an ethyl group, a 2-propyl group, and a 2-ethylhexyl group, and examples of the aryl group and heterocydic group includes the groups listed above; $R_3$ is an acid group, such as carboxylic acid, sulfonic acid, phosphonic acid, boronic acid, and phenols; and Z1 and Z2 are each a substituent for forming a ring structure where examples of Z1 include a condensation hydrocarbon-based compound (e.g., a benzene ring and a naphthalene ring) and a hetero ring (e.g., a thiophene ring, and a furan ring) all of which may have a substituent, specific examples thereof include the above-listed alkyl group, and an alkoxy group (e.g., a methoxy group, an ethoxy group, and a 2-isopropoxy group), and examples of Z2 include the following (A-1) to (A-22).)

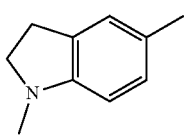
(A-1)

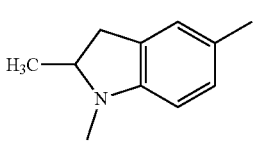
(A-2)

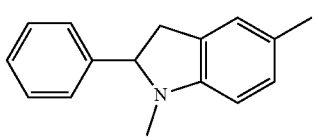
(A-3)

-continued
(A-4) 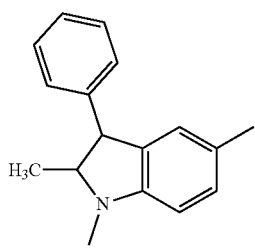
(A-5) 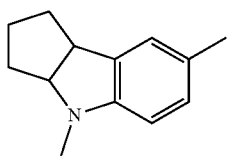
(A-6) 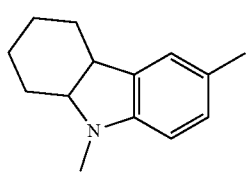
(A-7) 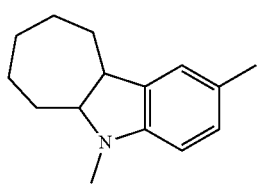
(A-8) 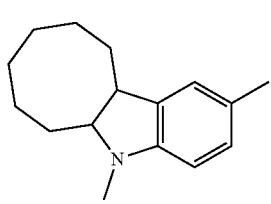
(A-9) 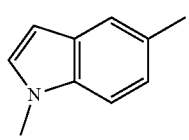
(A-10) 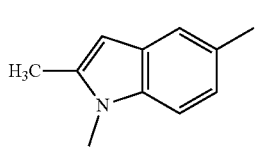
-continued
(A-11) 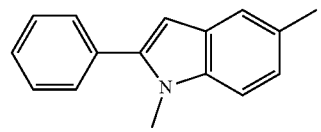
(A-12) 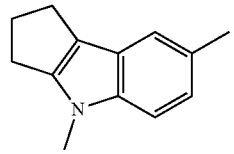
(A-13) 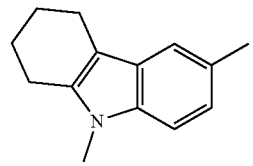
(A-14) 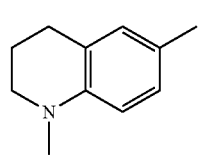
(A-15) 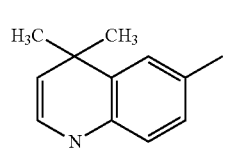
(A-16) 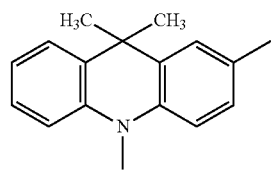
(A-17) 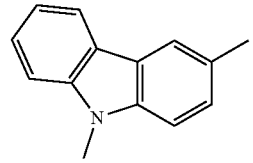
(A-18) 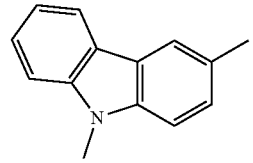

(A-19)
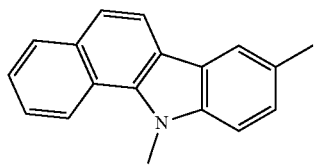
(A-20)
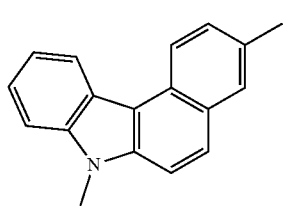
(A-21)
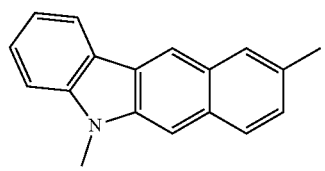
(A-22)
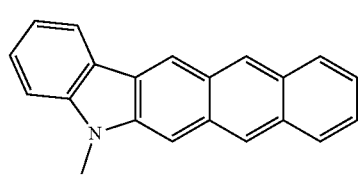
Specific examples of the photosensitizing compound represented by General Formula (3) include the following (B-1) to (B-28). However, the photosensitizing compound is not limited to the following examples.
(B-1)
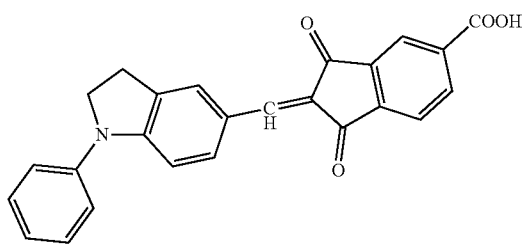
(B-2)
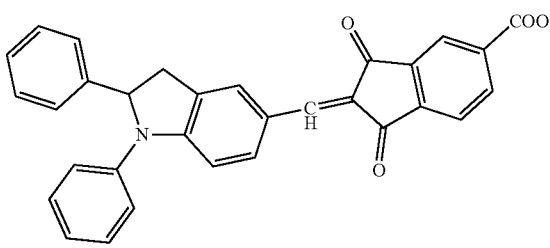
(B-3)
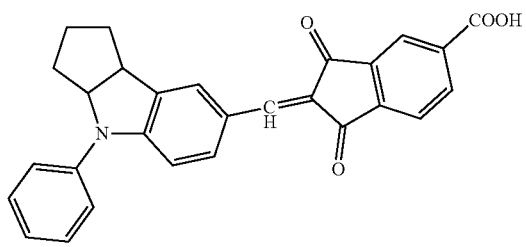
(B-4)
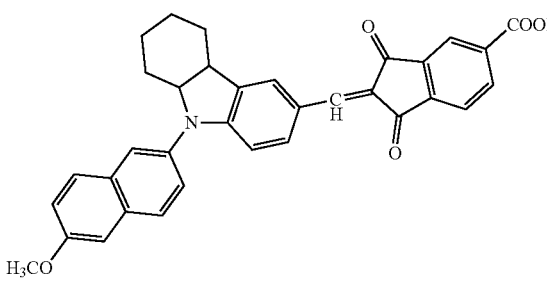
(B-5)
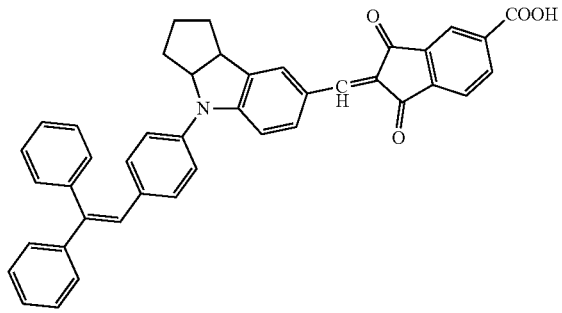
(B-6)
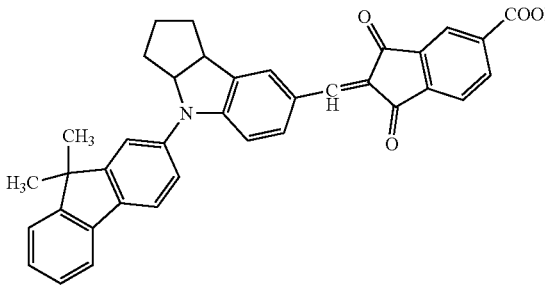

-continued
(B-7)
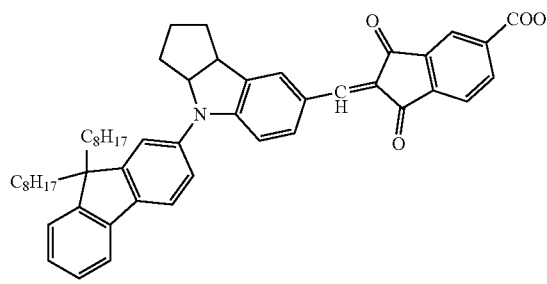
(B-8)
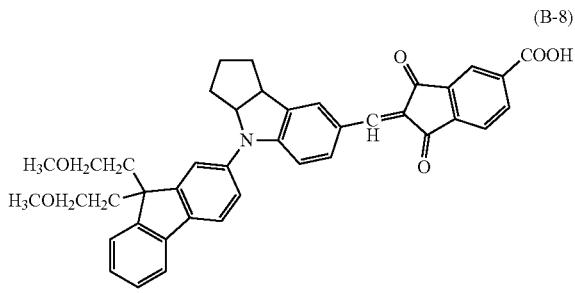
(B-9)
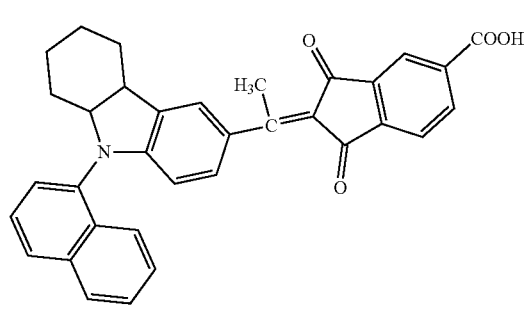
(B-10)
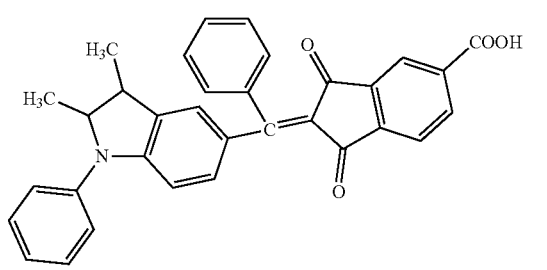
(B-11)
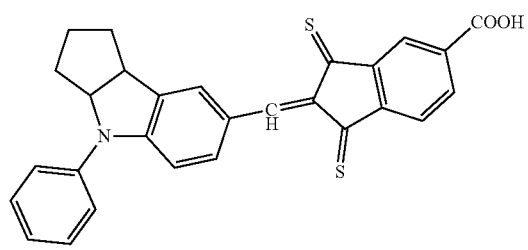
(B-12)
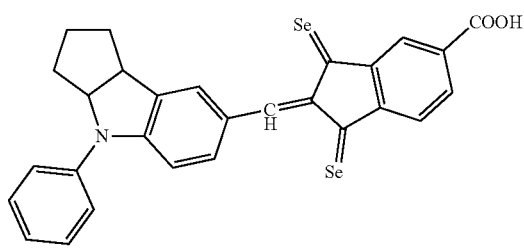
(B-13)
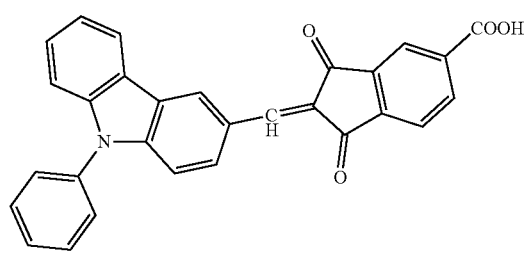
(B-14)
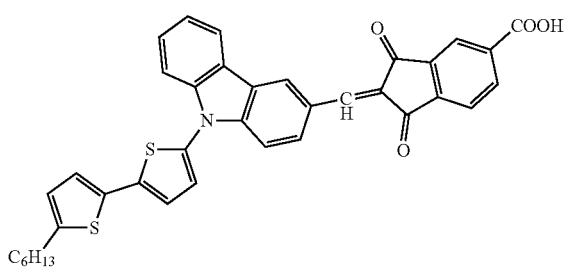
(B-15)
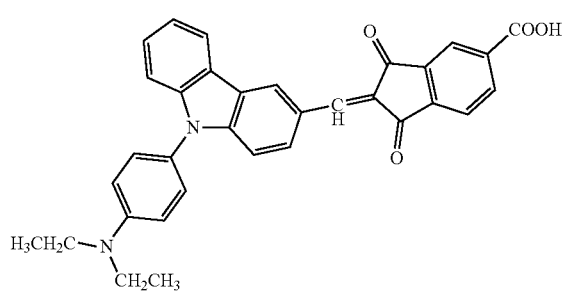
(B-16)
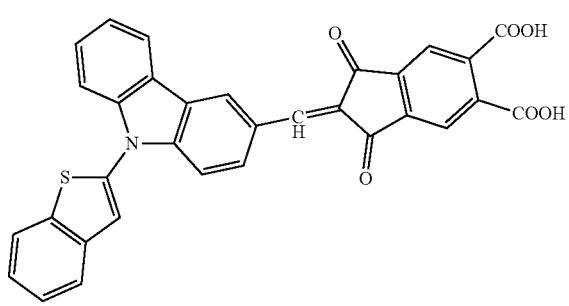

-continued
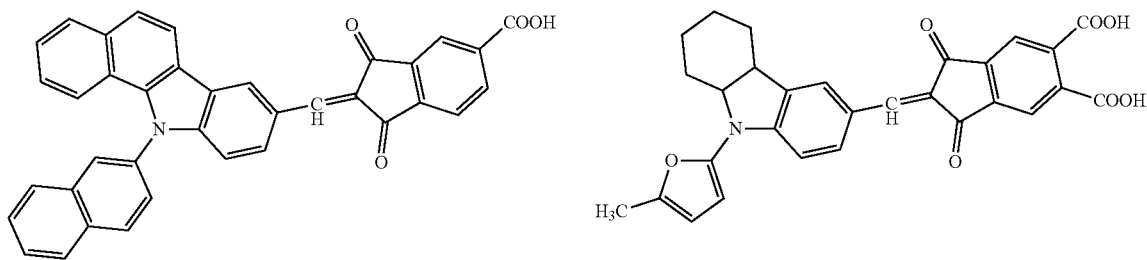
(B-17) (B-18)
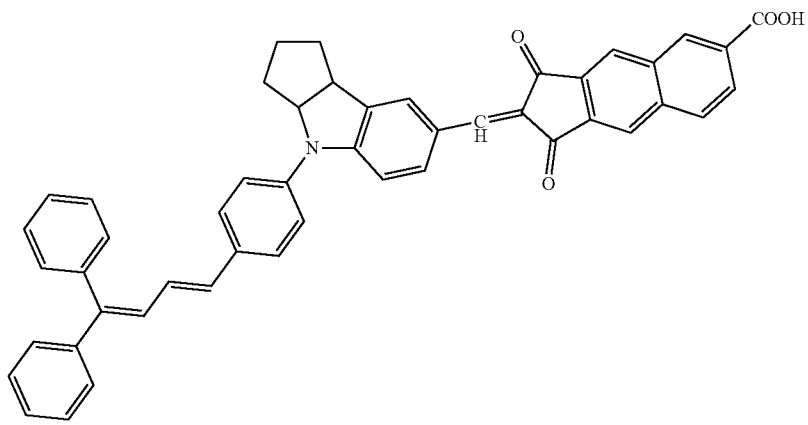
(B-19)
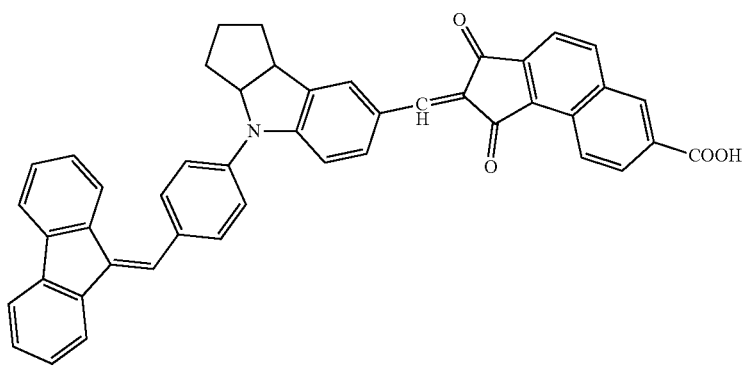
(B-20)
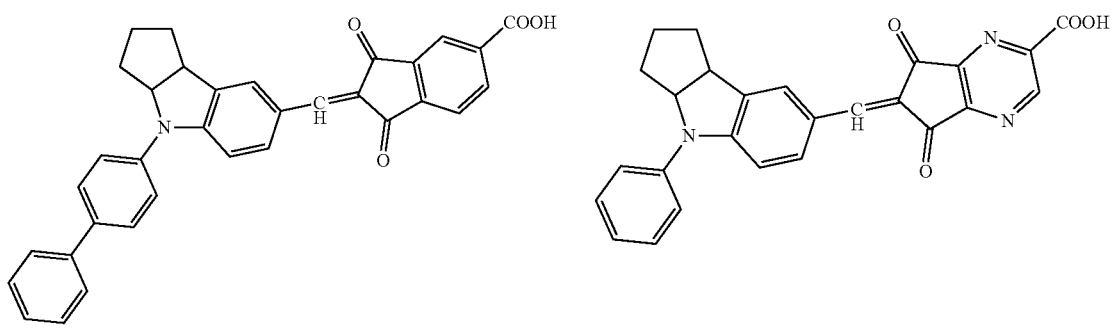
(B-21) (B-22)

(B-23)
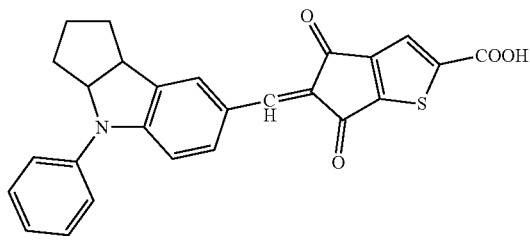

(B-24)
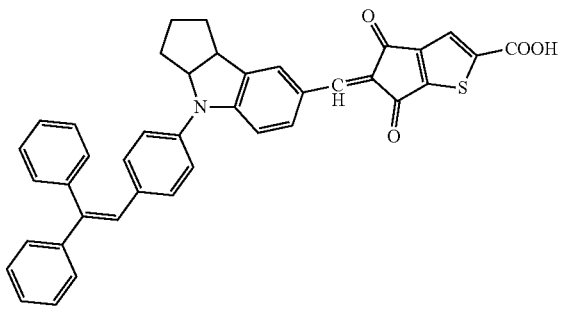

(B-25)
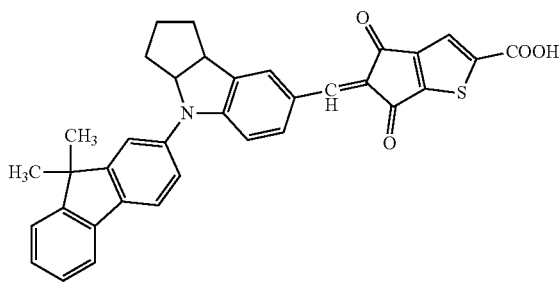

(B-26)
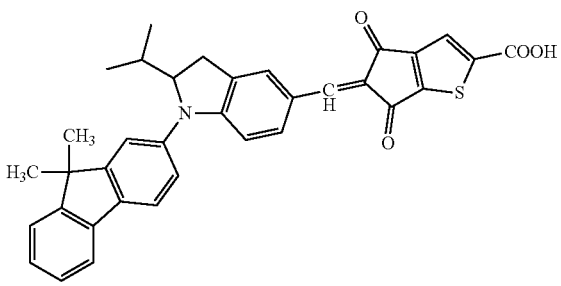

(B-27)
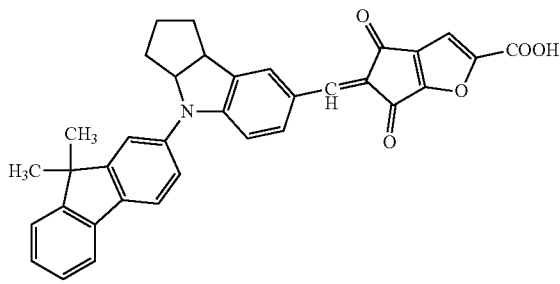

(B-28)

As a method for making the photosensitizing compound adsorbed on a surface of the semiconductor material of the electron-transporting layer, a method where the electron-transporting layer including the semiconductor material is immersed in a solution or dispersion liquid of the photosensitizing compound, or a method where a solution or dispersion liquid of the photosensitizing compound is applied onto the electron-transporting layer to adsorb the photosensitizing compound can be used. In case of the method of immersing the electron-transporting layer to which the semiconductor material is formed in a solution or dispersion liquid of the photosensitizing compound, an immersion method, a dipping method, a roller method, or an air knife method can be used. In case of the method for applying a solution or dispersion liquid of the photosensitizing compound to the electron-transporting layer to make the photosensitizing compound adsorbed on the electron-transporting layer, wire bar coating, slide hopper coating, extrusion coating, curtain coating, spin coating, or spray coating can be used. Moreover, it is also possible to adsorb the photosensitizing compound on the electron-transporting layer in a supercritical fluid using carbon dioxide etc.

When the photosensitizing compound is adsorbed on the semiconductor material, a condensing agent may be used in combination.

The condensing agent may be an agent that exhibits a catalytic function to physical or chemical bind a photosensitizing compound to a surface of a semiconductor material, or an agent that exhibits a stoichiometric function to move a chemical equilibrium advantageously. Moreover, thiol or a hydroxyl compound may be added as a condensation auxiliary.

Examples of the solvent in which the photosensitizing compound is dissolved or dispersed include water, an alcohol solvent, a ketone solvent, an ester solvent, an ether solvent, an amide solvent, a halogenated hydrocarbon solvent, and a hydrocarbon solvent.

Examples of the alcohol solvent include methanol, ethanol, and isopropyl alcohol.

Examples of the ketone solvent include acetone, methyl ethyl ketone, and methyl isobutyl ketone.

Examples of the ester solvent include ethyl formate, ethyl acetate, and n-butyl acetate.

Examples of the ether solvent include diethyl ether, dimethoxy ethane, tetrahydrofuran, dioxolane, and dioxane.

Examples of the amide solvent include N,N-dimethylformamide, N,N-dimethylacetamide, and N-methyl-2-pyrrolidone.

Examples of the halogenated hydrocarbon solvent include dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene.

Examples of the hydrocarbon solvent include n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene.

The above-listed examples may be used alone or in combination.

Since there is a photosensitizing compound that may function more effectively when aggregates between compounds are prevented, depending on a kind of the photosensitizing compound for use, an aggregate dissociating agent may be used in combination.

The aggregate dissociating agent is not particularly limited and may be appropriately selected depending on a dye for use. The aggregate dissociating agent is preferable a steroid compound (e.g., cholic acid and chenodexycholic acid), long-chain alkyl carboxylic acid, or long-chain alkyl phosphonic acid.

An amount of the aggregate dissociating agent is preferably 0.01 parts by mass or greater but 500 parts by mass or less, and more preferably 0.1 parts by mass or greater but 100 parts by mass or less, relative to 1 part by mass of the photosensitizing compound.

A temperature at the time when the photosensitizing compound alone or a combination of the photosensitizing compound and the aggregate dissociating agent are adsorbed on a surface of the semiconductor material constituting the electron-transporting layer is preferably −50° C. or higher but 200° C. or lower. The adsorption duration is preferably 5 seconds or longer but 1,000 hours or shorter, more preferably 10 seconds or longer but 500 hours or shorter, and even more preferably 1 minute or longer but 150 hours or shorter. The process of adsorption is preferably performed in the dark. Moreover, the process of adsorption may be performed with still standing or with stirring.

A method for stirring is not particularly limited and may be appropriately selected depending on the intended purpose. Examples of the method include methods using a stirrer, a ball mill, a paint conditioner, a sand mill, Attritor, a disperser, and ultrasonic disperser.

«Hole-Transporting Layer»

Any of materials known in the art can be used for the hole-transporting layer as long as the material has a function of transporting holes. Examples of the materials include an electrolytic solution obtained by dissolving a redox couple in an organic solvent, a gel electrolyte obtained by impregnating a polymer matrix with a liquid obtained by dissolving a redox couple in an organic solvent, a molten salt including a redox couple, a solid electrolyte, an inorganic hole-transporting material, and an organic hole-transporting material. Among the above-listed examples, an electrolytic solution or gel electrolyte may be used, but a solid electrolyte is preferable and an organic hole-transporting material is more preferable.

The hole-transporting layer includes a basic compound represented by General Formula (1) below or General Formula (2) below.

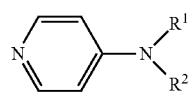

General Formula (1)

(In General Formula (1), $R_1$ and $R_2$ are each independently an alkyl group or an aromatic hydrocarbon group, where $R_1$ and $R_2$ may be identical or different groups, or $R_1$ and $R_2$ may be bonded to each other to form a heterocydic group including a nitrogen atom.)

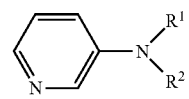

General Formula (2)

(In General Formula (2), $R_1$ and $R_2$ are each independently an alkyl group or an aromatic hydrocarbon group, where $R_1$ and $R_2$ may be identical or different groups, or $R_1$ and $R_2$ may be bonded to each other to form a heterocydic group including a nitrogen atom.)

The hole-transporting layer preferably includes the basic compound represented by General Formula (1) or General Formula (2). The hole-transporting layer including the basic compound represented by General Formula (1) or General Formula (2) is advantageous because output stability of the photoelectric conversion element is enhanced. Particularly, it is advantageous because fluctuations in output properties with low illuminance light are reduced and power is stably generated.

Specific exemplary compounds of the basic compound represented by General Formula (1) or General Formula (2) are presented below, but the basic compound is not limited to these examples.

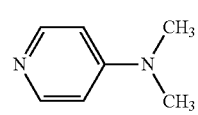

(C-1)

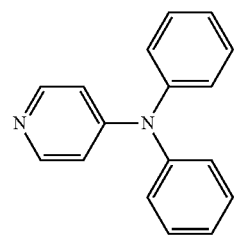

(C-2)

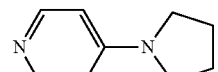

(C-3)

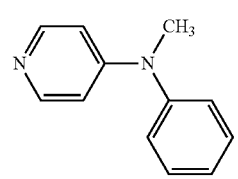

(C-4)

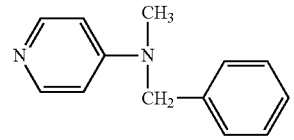

(C-5)

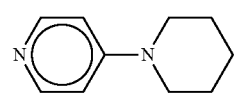

(C-6)

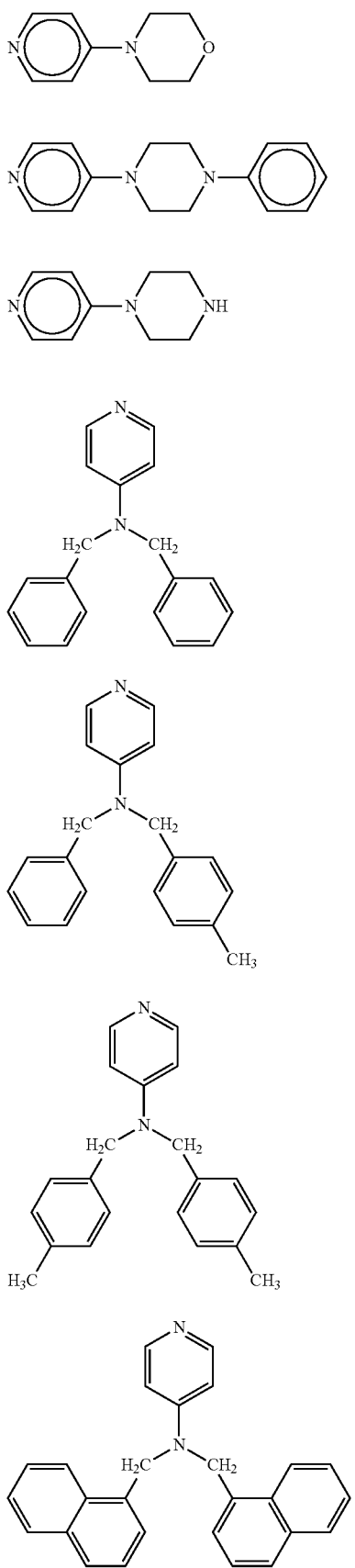
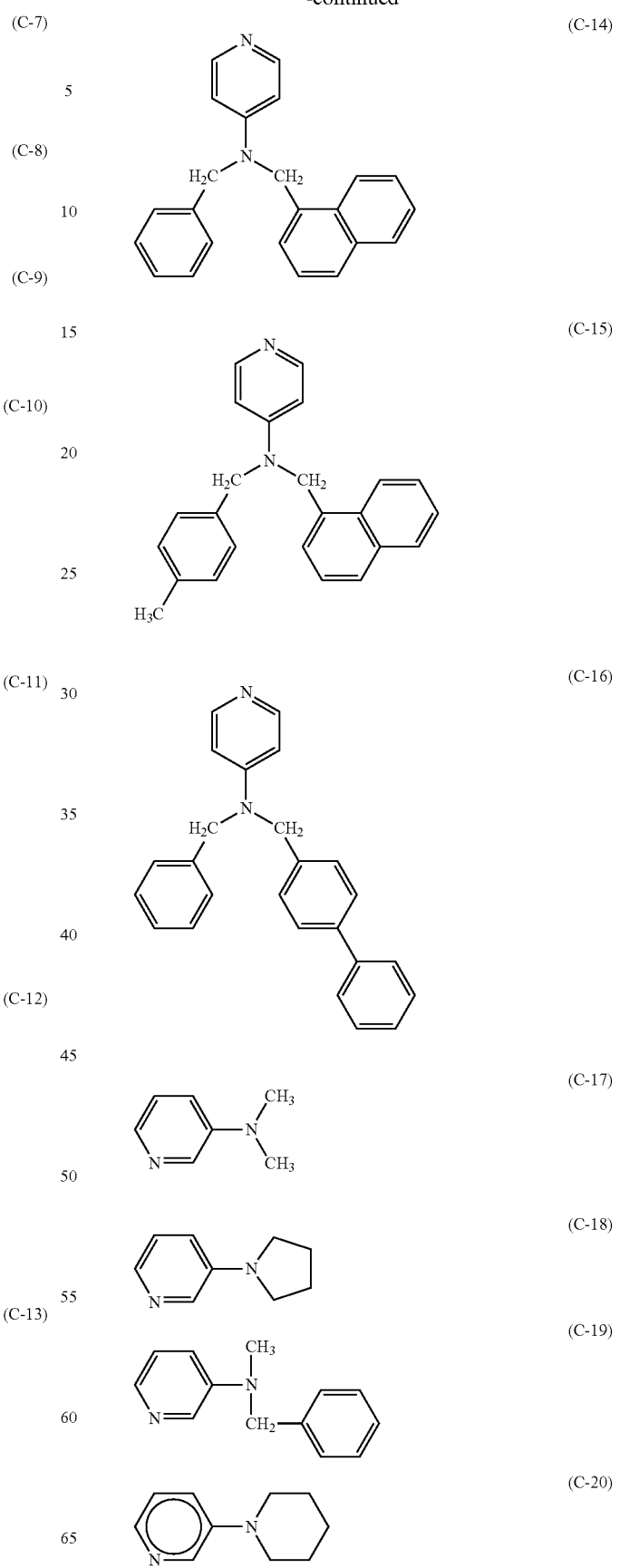

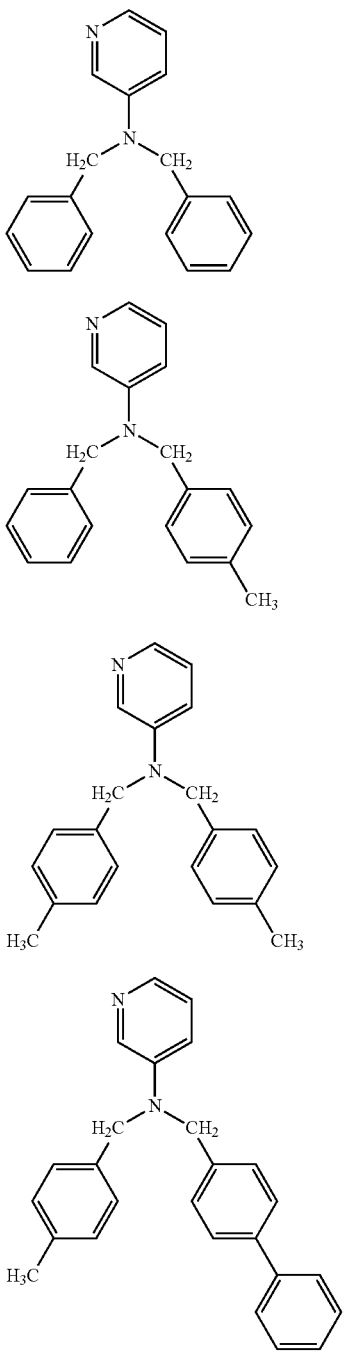

(C-21)

(C-22)

(C-23)

(C-24)

An amount of the basic compound represented by General Formula (1) or General Formula (2) in the hole-transporting layer is preferably 1 part by mass or greater but 50 parts by mass or less, more preferably 10 parts by mass or greater but 30 parts by mass or less relative to 100 parts by mass of the hole-transporting material. When the amount of the basic compound is within the preferable range, high open-circuit voltage can be maintained, high output is obtained, and high stability and durability are obtained even when the photoelectric conversion element is used in various environments over a long period.

In order to impart a function of transporting holes to the hole-transporting layer, the hole-transporting layer includes a hole-transporting material or a p-type semiconductor material. As the hole-transporting material or the p-type semiconductor material, any of organic hole-transporting compounds known in the art can be used. Specific examples thereof include an oxadiazole compound, a triphenylmethane compound, a pyrazoline compound, a hydrazone compound, a tetraaryl benzidine compound, a stilbene compound, and a Spiro compound. Among the above-listed examples, a Spiro compound is more preferable.

The Spiro compound is preferably a compound represented by General Formula (4) below.

General Formula (4)

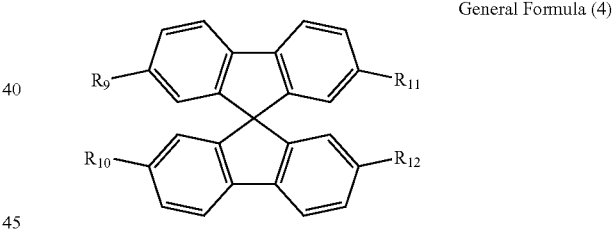

(In General Formula (4), $R_9$ to $R_{12}$ are each independently a substituted amino group, such as a dimethylamino group, a diphenylamino group, and a naphthyl-4-tolylamino group.)

Specific examples of the spiro compound are (D-1) to (D-20) listed below. However, the spiro compound is not limited to the following examples.

(D-1)

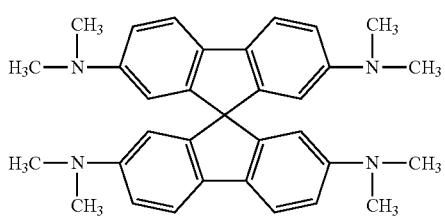

(D-2)

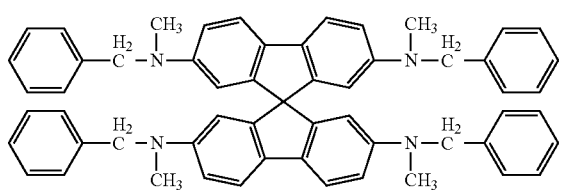

-continued
(D-3)
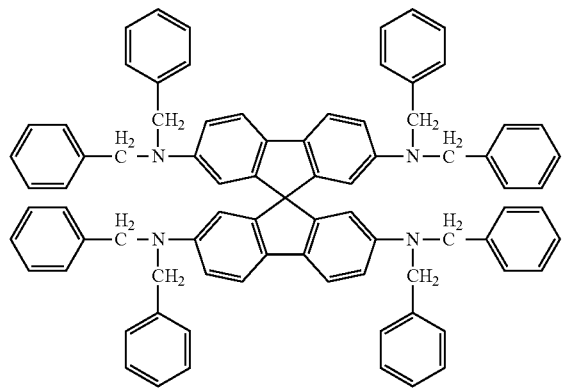
(D-4)
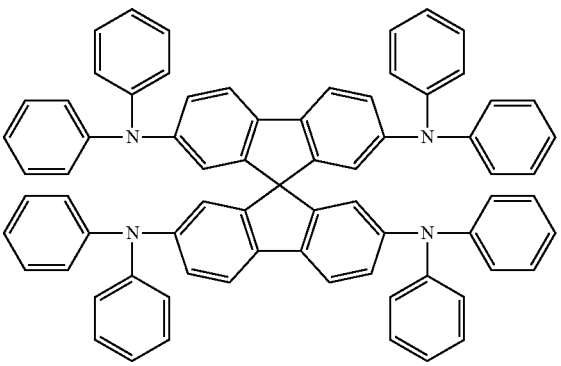
(D-5)
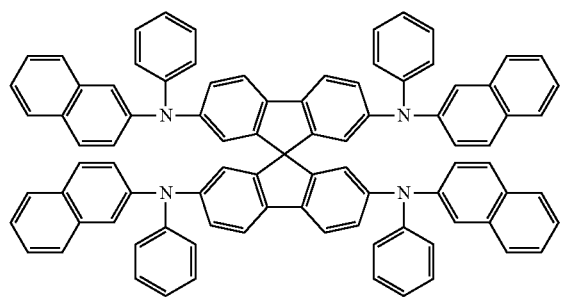
(D-6)
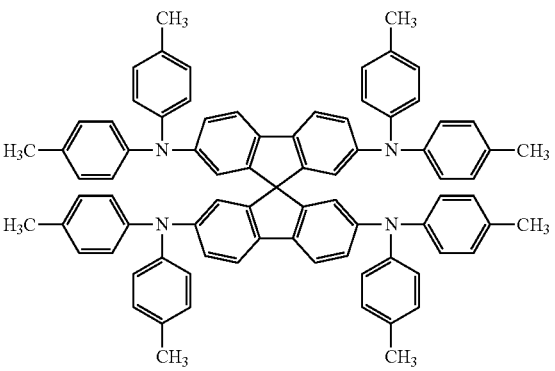
(D-7)
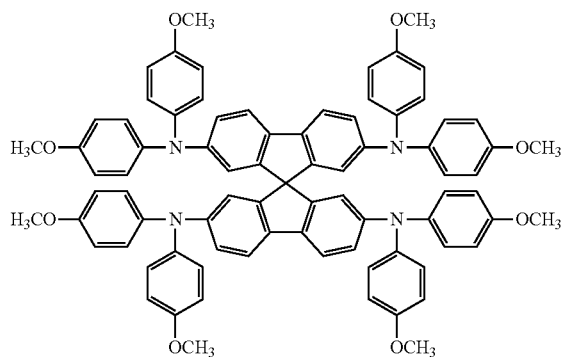
(D-8)
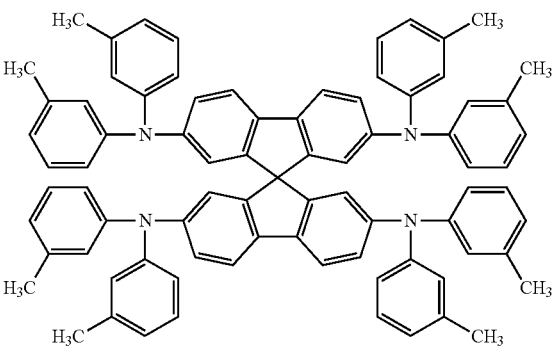
(D-9)
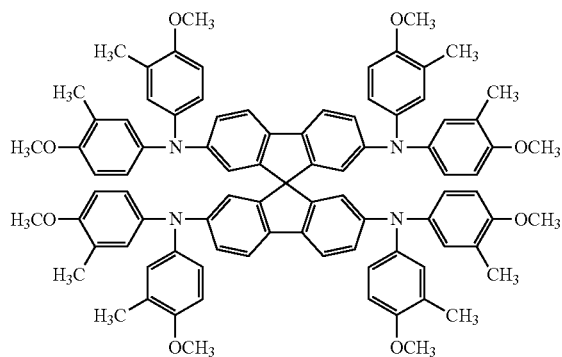
(D-10)
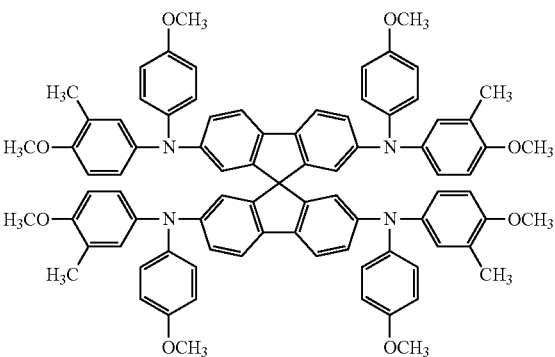

-continued
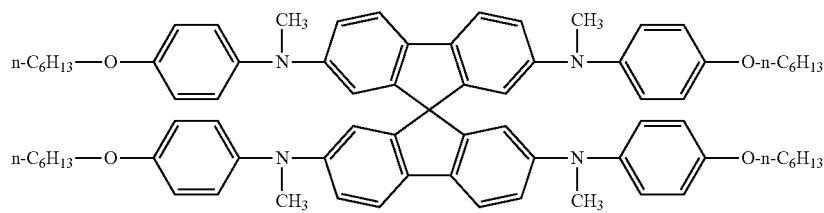
(D-11)
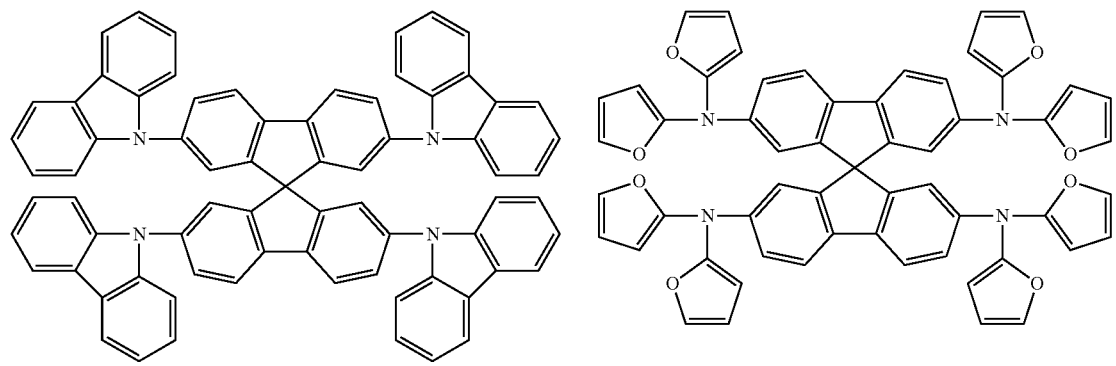
(D-12) (D-13)
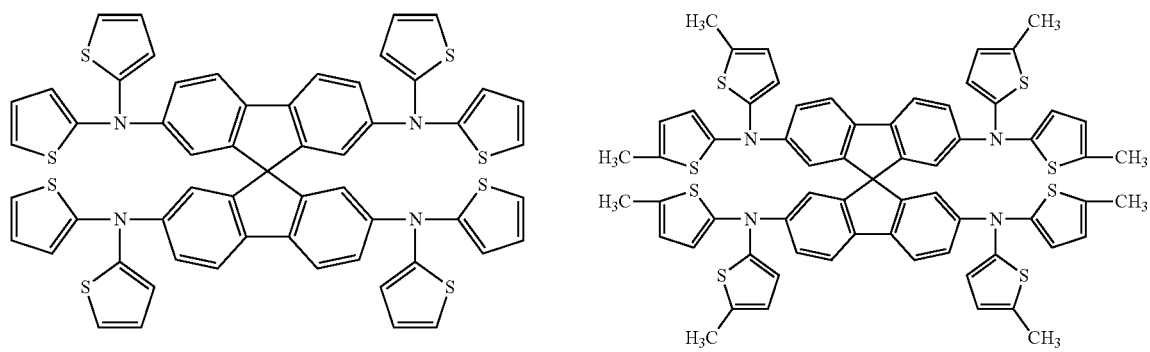
(D-14) (D-15)
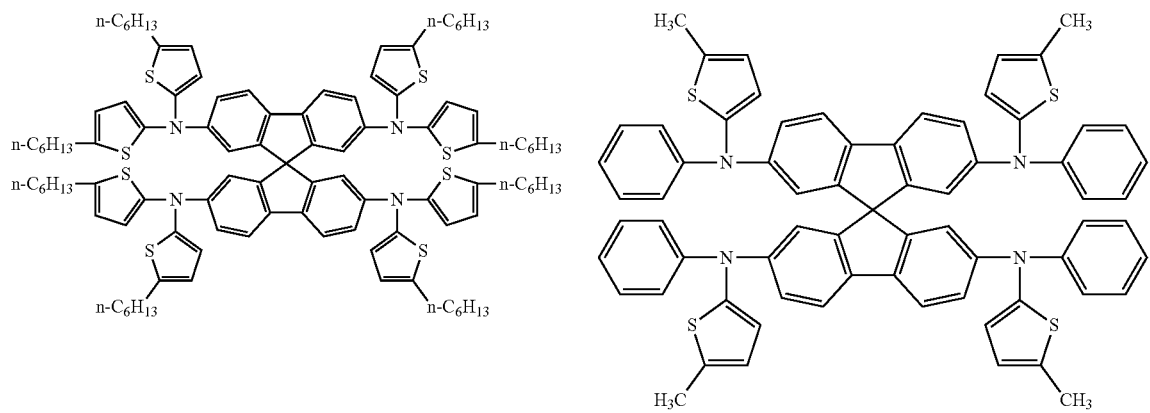
(D-16) (D-17)

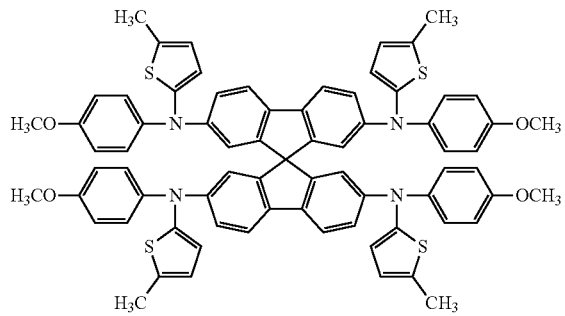
(D-18)

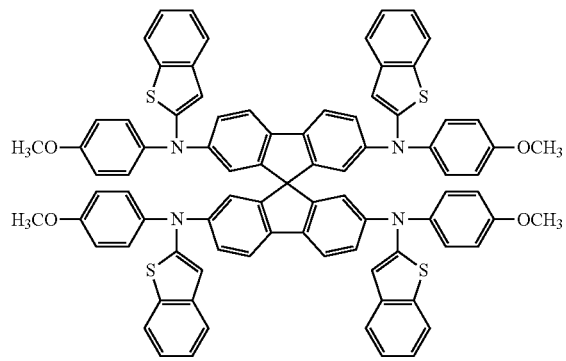
(D-19)

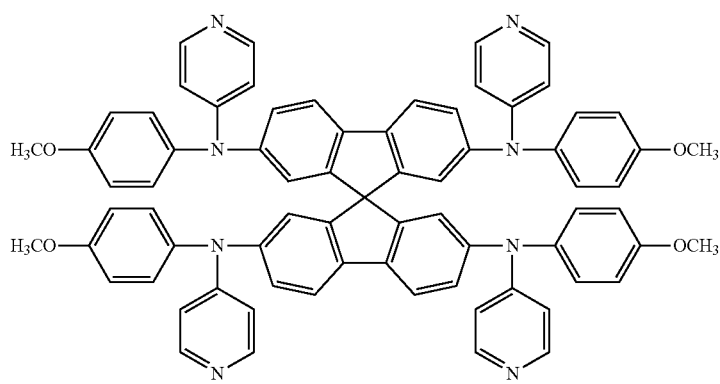
(D-20)

As well as having high hole mobility, each of the above-listed spiro compounds forms an electron cloud close to a sphere because two bendizine skeleton molecules are bonded with twisting and therefore hopping conductivity is excellent. As a result, excellent photoelectric conversion performance is obtained. Moreover, the spiro compound is also highly dissolvable and therefore is dissolved in various organic solvents. Since the spiro compound is amorphous (an amorphous material without having a crystal structure), the spiro compound is easily densely deposited in the porous electron-transporting layer. Furthermore, the spiro compound does not absorb light having a wavelength of 450 nm or longer and therefore light is effectively absorbed in the photosensitizing compound. Accordingly, the spiro compound is particularly preferable for a solid dye-sensitized solar cell.

In addition to the hole-transporting material and the basic compound, the hole-transporting layer preferably includes an oxidizing agent. The presence of the oxidizing agent in the hole-transporting material can improve conductivity and enhance durability and stability of the output properties.

Examples of the oxidizing agent include tris(4-bromophenynaminium hexachloroantimonate, silver hexafluoroantimonate, nitrosonium tetrafluoroborate, silver nitrate, and a metal complex. Among the above-listed examples, a metal complex is more preferable. Use of a metal complex as the oxidizing agent is advantageous because a large amount of the metal complex can be added as the metal complex has high solubility to an organic solvent.

The metal complex is made up of a metal cation, a ligand, and an anion.

Examples of the metal cation includes cations of chromium, manganese, zinc, iron, cobalt, nickel, copper, molybdenum, ruthenium, rhodium, palladium, silver, tungsten, rhenium, osmium, iridium, vanadium, gold, and platinum. Among the above-listed example, cations of cobalt, iron, nickel, and copper are preferable, and a cobalt complex is more preferable. The ligand is preferably a ligand including a 5- and/or 6-membered heterocycle including at least one nitrogen atom, where the ligand may include a substituent. Specific examples of the ligand are listed below, but the ligand is not limited to the following examples.

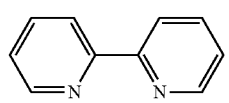
(E-1)

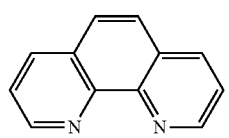
(E-2)

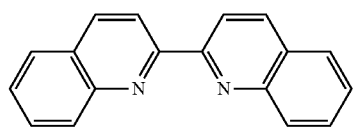
(E-3)

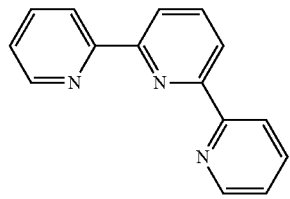
(E-4)

(E-5) 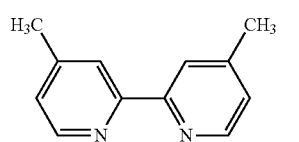
(E-6) 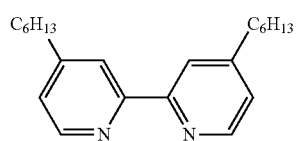
(E-7) 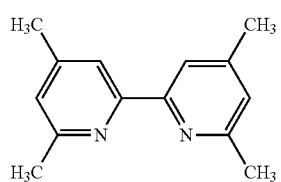
(E-8) 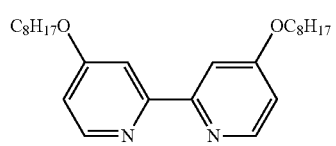
(E-9) 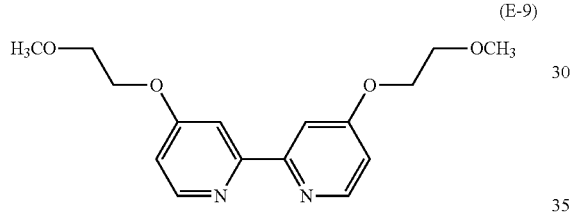
(E-10) 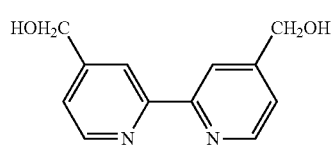
(E-11) 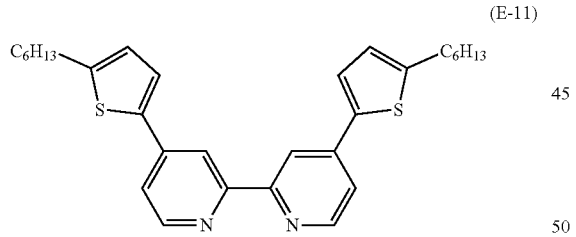
(E-12) 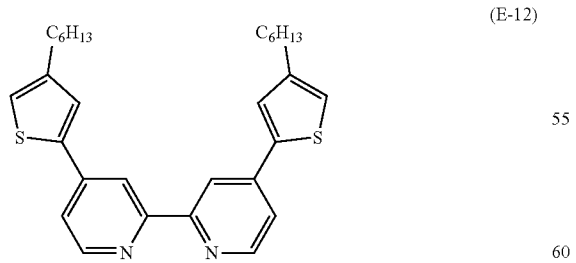
(E-13) 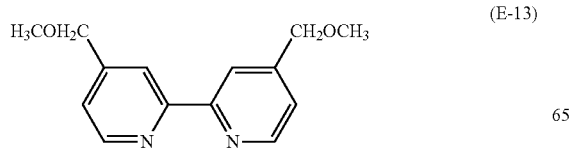
(E-14) 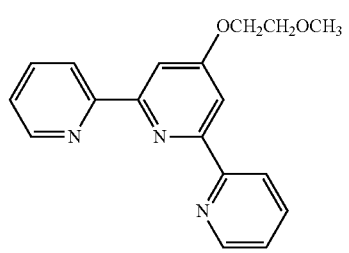
(E-15) 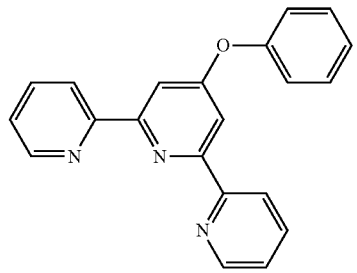
(E-16) 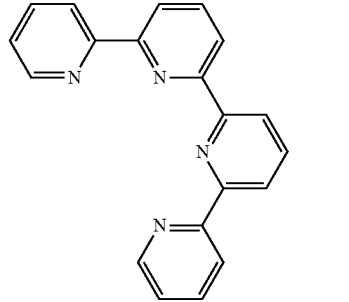
(E-17) 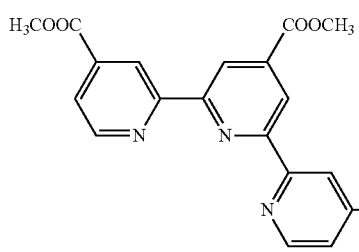
(E-18) 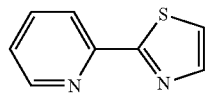
(E-19) 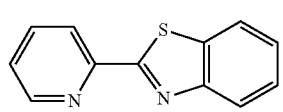
(E-20) 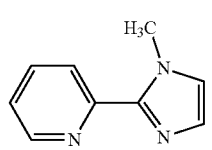
(E-21) 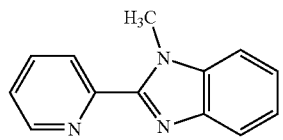

-continued

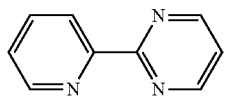
(E-22)

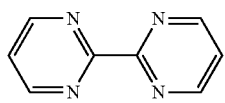
(E-23)

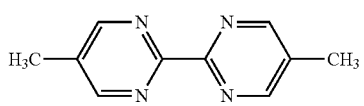
(E-24)

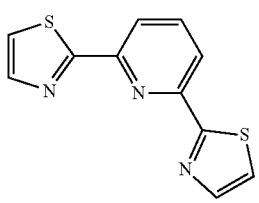
(E-25)

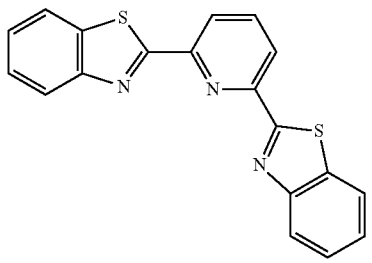
(E-26)

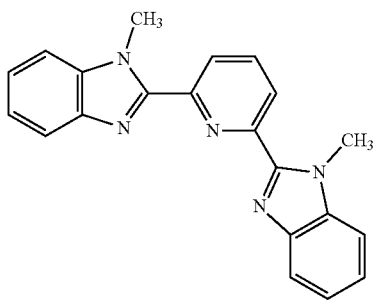
(E-27)

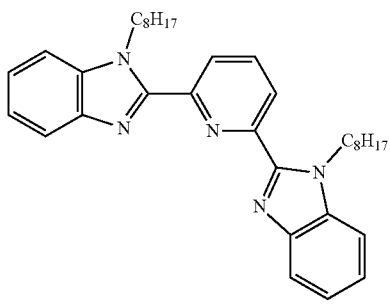
(E-28)

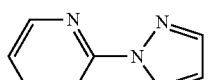
(E-29)

-continued

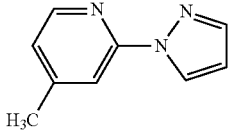
(E-30)

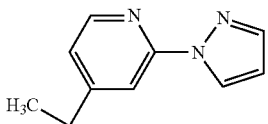
(E-31)

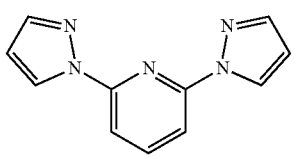
(E-32)

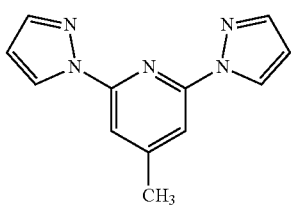
(E-33)

Examples of the anion include a hydride ion (H$^-$), a fluoride ion (F$^-$), a chloride ion (Cl$^-$), a bromide ion (Br$^-$), an iodide ion (I$^-$), a hydroxide ion (OH$^-$), a cyanide ion (CN$^-$), a nitric acid ion (NO$_3^-$), a nitrous acid ion (NO$_2^-$), a hypochlorous acid ion (ClO$^-$), a chlorous acid ion (ClO$_2^-$), a chloric acid ion (ClO$_3^-$), a perchloric acid ion (ClO$_4^-$), a permanganic acid ion (MnO$_4^-$), an acetic acid ion (CH$_3$COO$^-$), a hydrogen carbonate ion (HCO$_3^-$), a dihydrogen phosphate ion (H$_2$PO$_4^-$), a hydrogen sulfate ion (HSO$_4^-$), a hydrogen sulfide ion (HS$^-$), a thiocyanic acid ion (SCN$^-$), a tetrafluoroboric acid ion (BF$_4^-$), a hexafluorophosphate ion (PF$_6^-$), a tetracyanoborate ion (B(CN)$_4^-$), a dicyanoamine ion (N(CN)$_2^-$), a p-toluenesulfonic acid ion (TsO$^-$), a trifluoromethyl sulfonate ion (CF$_3$SO$_2^-$), a bis(trifluoromethylsulfonyl)amine ion (N(SO$_2$CF$_3$)$^{2-}$), a tetrahydroxoaluminate ion ([Al(OH)$_4$]$^-$ or [Al(OH)$_4$(H$_2$O)$_2$]$^-$), a dicyanoargentate (I) ion ([Ag(CN)$_2$]$^-$), a tetrahydroxochromate (III) ion ([Cr(OH)$_4$]$^-$), a tetrachloroaurate (III) ion ([AuCl$_4$]$^-$), an oxide ion (O$^{2-}$), a sulfide ion (S$^{2-}$), a peroxide ion (O$_2^{2-}$), a sulfuric acid ion (SO$_4^{2-}$), a sulfurous acid ion (SO$_3^{2-}$), a thiosulfuric acid (S$_2$O$_3^{2-}$), a carbonic acid ion (CO$_3^{2-}$), a chromic acid ion (CrO$_4^{2-}$), a dichromic acid ion (Cr$_2$O$_7^{2-}$), a monohydrogen phosphate ion (HPO$_4^{2-}$), a tetrahydroxozincate (II) ion ([Zn(OH)$_4$]$^{2-}$), a tetracyanozincate (II) ion ([Zn(CN)$_4$]$^{2-}$), a tetrachlorocuprate (II) ion ([CuCl$_4$]$^{2-}$), a phosphoric acid ion (PO$_4^{3-}$), a hexacyanoferrate (III) ion ([Fe(CN)$_6$]$^{3-}$), a bis(thiosulfate) argentat (I) ion ([Ag(S$_2$O$_3$)$_2$]$^{3-}$), and a hexacyanoferrate (II) ion ([Fe(CN)$_6$]$^{4-}$). Among the above-listed examples, a tetrafluoroboric acid ion, a hexafluorophosphate ion, a tetracyanoborate ion, a bis(trifluoromethylsulfonyl)amine ion, and a perchloric acid ion are preferable.

Among the above-listed metal complexes, trivalent cobalt complexes represented by Structural Formulae (4) and (5) below are particularly preferable. Use of the trivalent cobalt complex as the metal complex is advantageous because a reduction in output with light of low illuminance can be prevented before and after being exposed to light of high illuminance.

Structural Formula (4)

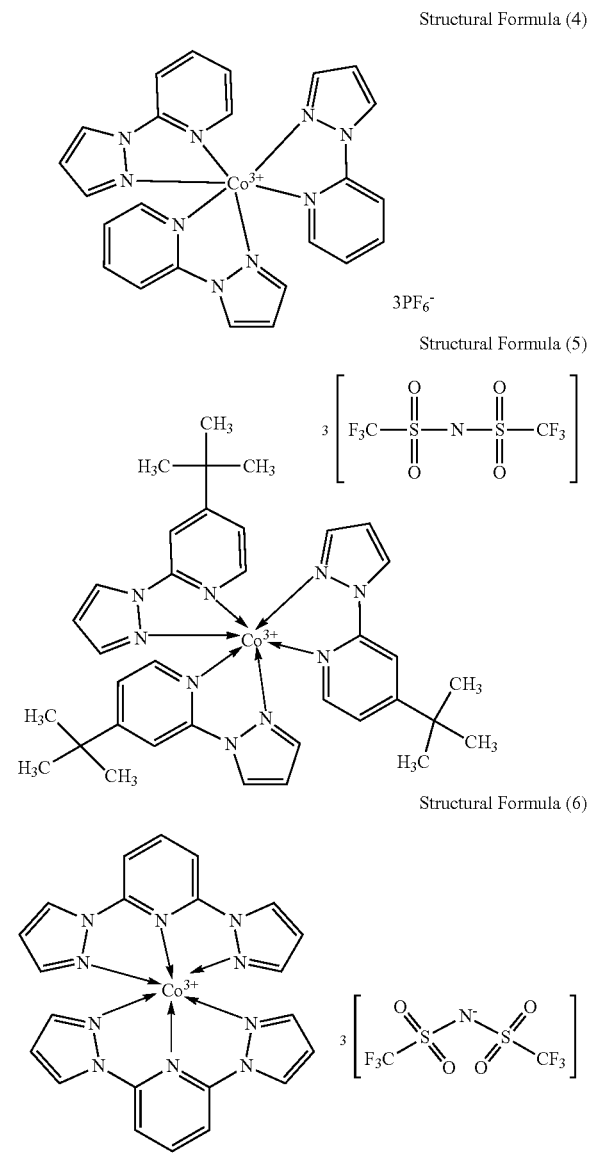

Structural Formula (5)

Structural Formula (6)

The above-listed examples may be used alone or in combination.

An amount of the oxidizing agent is preferably 0.5 parts by mass or greater but 30 parts by mass or less, and more preferably 1 part by mass or greater but 15 parts by mass or less relative to 100 parts by mass of the hole-transporting material. It is not necessary to oxidize the entire hole-transporting material through the addition of the oxidizing agent and the addition thereof is effective as long as at least part of the hole-transporting material is oxidized.

Moreover, the hole-transporting layer preferably further includes an alkali metal salt. When the hole-transporting layer includes an alkali metal salt, output can be improved, and moreover light irradiation resistance or resistance to high temperature storage can be improved.

Examples of the alkali metal salt include: lithium salts, such as lithium chloride, lithium bromide, lithium iodide, lithium perchlorate, lithium bis(trifluoromethanesulfonyl) diimide, lithium diisopropyl imide, lithium acetate, lithium tetrafluoroborate, lithium pentafluorophosphate, and lithium tetracyanoborate; sodium salts, such as sodium chloride, sodium bromide, sodium iodide, sodium perchlorate, sodium bis(trifluoromethanesulfonyl)diimide, sodium acetate, sodium tetrafluoroborate, sodium pentafluorophosphate, and sodium tetracyanoborate; and potassium salts, such as potassium chloride, potassium bromide, potassium iodide, and potassium perchlorate. Among the above-listed examples, lithium bis(trifluoromethanesulfonyl)diimide and lithium diisopropyl imide are preferable.

An amount of the alkali metal salt is preferably 1 part by mass or greater but 50 parts by mass or less, and more preferably 5 parts by mass or greater but 30 parts by mass or less, relative to 100 parts by mass of the hole-transporting material.

The hole-transporting layer may have a single layer structure formed of a single material, or a laminate structure including a plurality of compounds. In the case where the hole-transporting layer has a laminate structure, a polymer material is preferably used for a layer of the hole-transporting layer disposed near the second electrode. Use of the polymer material having excellent film formability is advantageous because a surface of the porous electron-transporting layer can be made smoother and photoelectric conversion properties can be improved. Since the polymer material does not easily permeate the porous electron-transporting layer, moreover, a surface of the porous electron-transporting layer is desirably covered and an effect of preventing short circuits at the time when an electrode is disposed may be obtained.

Examples of the polymer material for use in the hole-transporting layer include hole transport polymer materials known in the art.

Examples of the hole transport polymer material include a polythiophene compound, a polyphenylene vinylene compound, a polyfluorene compound, a polyfluorene compound, a polyphenylene compound, a polyaryl amine compound, and a polythiadiazole compound.

Examples of the polythiophene compound include
poly(3-n-hexylthiophene), poly(3-n-octyloxythiophene),
poly(9,9'-dioctyl-fluorene-co-bithiophene),
poly(3,3'''-didodecyl-quaterthiophene),
poly(3,6-dioctylthieno[3,2-b]thiophene),
poly(2,5-bis(3-decylthiophen-2-yl)thieno[3,2-b]thiophene),
poly(3,4-didecylthiophene-co-thieno[3,2-b]thiophene),
poly(3,6-dioctylthieno[3,2-b]thiophene-co-thieno[3,2-b]thiophene),
poly(3,6-dioctylthieno[3,2-b]thiophene-co-thiophene), and
poly(3,6-dioctylthieno[3,2-b]thiophene-co-bithiophene).

Examples of the polyphenylene vinylene compound include
poly[2-methoxy-5-(2-ethylhexyloxy)-1,4-phenylenevinylene],
poly[2-methoxy-5-(3,7-dimethyloctyloxy)-1,4-phenylenevinylene], and
poly[(2-methoxy-5-(2-ethylhexyloxy)-1,4-phenylenevinylene)-co-(4,4'-biphe nylene-vinylene)].

Examples of the polyfluorene compound include
poly(9,9'-didodecylfluorenyl-2,7-diyl),
poly[(9,9-dioctyl-2,7-divinylenefluorene)-alt-co-(9,10-anthracene)],
poly[(9,9-dioctyl-2,7-divinylenefluorene)-alt-co-(4,4'-biphenylene)],
poly[(9,9-dioctyl-2,7-divinylenefluorene)-alt-co-(2-methoxy-5-(2-ethylhexyl oxy)-1,4-phenylene)], and poly[(9,9-dioctyl-2,7-diyl)-co-(1,4-(2,5-dihexyloxy)benzene)].

Examples of the polyphenylene compound include poly[2,5-dioctyloxy-1,4-phenylene] and poly[2,5-di(2-ethylhexyloxy-1,4-phenylene].

Examples of the polyaryl amine compound include poly[(9,9-dioctylfluorenyl-2,7-diyl)-alt-co-(N,N'-diphenyl)-N,N'-di(p-hexylp henyl)-1,4-diaminobenzene],
poly[(9,9-dioctylfluorenyl-2,7-diyl)-alt-co-(N,N'-bis(4-octyloxyphenyl)benzi dine-N,N'-(1,4-diphenylene)],
poly[(N,N'-bis(4-octyloxyphenyl)benzidine-N,N'-(1,4-diphenylene)],
poly[(N,N'-bis(4-(2-ethylhexyloxy)phenyl)benzidine-N,N'-(1,4-diphenylene)],
poly[phenylimino-1,4-phenylenevinylene-2,5-dioctyloxy-1,4-phenylenevin ylene-1,4-phenylene],
poly[p-tolyimino-1,4-phenylenevinylene-2,5-di(2-ethylhexyloxy)-1,4-pheny lenevinylene-1,4-phenylene], and
poly[4-(2-ethylhexyloxy)phenylimino-1,4-biphenylene].

Examples of the polythiadiazole compound include poly[(9,9-dioctylfluorenyl-2,7-diyl)-alt-co-(1,4-benzo(2,1',3)thiadiazole], and poly(3,4-didecylthiophene-co-(1,4-benzo(2,1',3)thiadiazole).

Among the above-listed examples, a polythiophene compound and a polyaryl amine compound are preferable in view of carrier mobility and ionization potential.

An average thickness of the hole-transporting layer is not particularly limited and may be appropriately selected depending on the intended purpose. The hole-transporting layer preferably has a structure where the hole-transporting layer penetrates pores of the porous electron-transporting layer. The average thickness of the hole-transporting layer on the electron-transporting layer is preferably 0.01 μm or greater but 20 μm or less, more preferably 0.1 μm or greater but 10 μm or less, and even more preferably 0.2 μm or greater but 2 pin or less.

The hole-transporting layer can be directly formed on the electron-transporting layer to which the photosensitizing compound is adsorbed. A production method of the hole-transporting layer is not particularly limited and may be appropriately selected depending on the intended purpose. Examples of the production method thereof include a method where a thin film is formed in vacuum, such as vapor deposition, and a wet film forming method. Among the above-listed examples, a wet film forming method is particularly preferable in view of a production cost. A method where the hole-transporting layer is applied onto the electron-transporting layer is preferable.

In the case where the wet film forming method is used, a coating method is not particularly limited and coating can be performed according to any of methods known in the art. In order to make Rc(50), which is a ratio of the area of the projected parts that are 50 nm or greater per unit area, small, preferred are blade coating, the coating, and gravure coating, which are known methods capable of performing smooth coating regardless of unevenness of a base.

Moreover, a film may be formed in a supercritical fluid or subcritical fluid having the lower temperature and pressure than critical points. The supercritical fluid is not particularly limited and may be appropriately selected depending on the intended purpose, as long as the supercritical fluid is a fluid that exists as a non-condensable high-pressure fluid in the temperature and pressure region exceeding the limits (critical points) where a gas and a liquid can coexist and is not condensed as being compressed, and is a fluid in the state equal to or higher the critical temperature and equal to or higher than the critical pressure. The supercritical fluid is preferably a supercritical fluid having a low critical temperature.

Examples of the supercritical fluid include carbon monoxide, carbon dioxide, ammonia, nitrogen, water, an alcohol solvent, a hydrocarbon solvent, a halogen solvent, and an ether solvent.

Examples of the alcohol solvent include methanol, ethanol, and n-butanol.

Examples of the hydrocarbon solvent include ethane, propane, 2,3-dimethylbutane, benzene, and toluene. Examples of the halogen solvent include methylene chloride and chlorotrifluoromethane.

Examples of the ether solvent include dimethyl ether.

The above-listed examples may be used alone or in combination.

Among the above-listed examples, carbon dioxide is preferable because carbon dioxide has critical pressure of 7.3 MPa and a critical temperature of 31° C., and therefore a supercritical state of carbon dioxide is easily formed and carbon dioxide is inflammable and easily handled.

The subcritical fluid is not particularly limited and may be appropriately selected depending on the intended purpose, as long as the subcritical fluid is a fluid that exists as a high-pressure liquid in the temperature and pressure region near the critical points. The compounds listed as the supercritical compound can be also suitably used as the subcritical fluid.

The critical temperature and critical pressure of the supercritical fluid are is not particularly limited and may be appropriately selected depending on the intended purpose. The critical temperature is preferably −273° C. or higher but 300° C. or lower, and more preferably 0° C. or higher but 200° C. or lower.

In addition to the supercritical fluid or subcritical fluid, moreover, an organic solvent or an entrainer may be used in combination. A solubility in the supercritical fluid can be easily performed by adding the organic solvent or the entrainer.

The organic solvent is not particularly limited and may be appropriately selected depending on the intended purpose. Examples of the organic solvent include a ketone solvent, an ester solvent, an ether solvent, an amide solvent, a halogenated hydrocarbon solvent, and a hydrocarbon solvent.

Examples of the ketone solvent include acetone, methyl ethyl ketone, and methyl isobutyl ketone.

Examples of the ester solvent include ethyl formate, ethyl acetate, and n-butyl acetate.

Examples of the ether solvent include diisopropyl ether, dimethoxy ethane, tetrahydrofuran, dioxolane, and dioxane.

Examples of the amide solvent include N,N-dimethylformamide, N,N-dimethylacetamide, and N-methyl-2-pyrrolidone.

Examples of the halogenated hydrocarbon solvent include dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene.

Examples of the hydrocarbon solvent include n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene.

The above-listed examples may be used alone or in combination.

After laminating the hole-transporting material on the electron-transporting layer to which the photosensitizing compound is adsorbed, moreover, pressing may be performed. Since the hole-transporting material is more closely attached to the electron-transporting layer that is a porous electrode by performing the pressing, efficiency may be improved.

A method of the pressing is not particularly limited and may be appropriately selected depending on the intended purpose. Examples of the method thereof include press molding using a plate, such as IR pellet press, and roll pressing using a roller.

The pressure is preferably 10 kgf/cm$^2$ or greater, and more preferably 30 kgf/cm$^2$ or greater.

The duration of the pressing is not particularly limited and may be appropriately selected depending on the intended purpose. The duration is preferably 1 hour or shorter. Moreover, heat may be applied at the time of the pressing. At the time of the pressing, a release agent may be disposed between a press and the electrode.

Examples of the release agent include fluororesins, such as polyethylene tetrafluoride, polychloro ethylene trifluoride, an ethylene tetrafluoride-propylene hexafluoride copolymer, a perfluoroalkoxy fluorocarbon resin, polyvinylidene fluoride, an ethylene-ethylene tetrafluoride copolymer, an ethylene-chloroethylene trifluoride copolymer, and polyvinyl fluoride. The above-listed examples may be used alone or in combination.

After performing the pressing but before disposing a second electrode, metal oxide may be disposed between the hole-transporting material and the second electrode.

Examples of the metal oxide include molybdenum oxide, tungsten oxide, vanadium oxide, and nickel oxide. The above-listed examples may be used alone or in combination. Among the above-listed examples, molybdenum oxide is preferable.

A method for disposing the metal oxide on the hole-transporting layer is not particularly limited and may be appropriately selected depending on the intended purpose. Examples of the method include a method where a thin film is formed in vacuum, such as sputtering and vacuum vapor deposition, and a wet film forming method.

As the wet film forming method, a method where a paste in which powder or sol of metal oxide is dispersed is prepared and the paste is applied onto the hole-transporting layer is preferable. In the case where the wet film forming method is used, a coating method is not particularly limited and may be performed according to any of methods known in the art. Examples of the coating method include dip coating, spray coating, wire bar coating, spin coating, roller coating, blade coating, and gravure coating. As a wet printing method, moreover, various methods, such as relief printing, offset printing, gravure printing, intaglio printing, rubber plate printing, and screen printing, can be used.

An average thickness of the applied metal oxide is preferably 0.1 nm or greater but 50 nm or less, and more preferably 1 nm or greater but 10 nm or less.

«Second Electrode»

The second electrode may be formed on the hole-transporting layer or the metal oxide of the hole-transporting layer. As the second electrode, moreover, an electrode identical to the first electrode may be used. In the case where the strength of the second electrode can be sufficiently secured, a support is not necessarily required.

Examples of a material of the second electrode include metal, a carbon compound, conductive metal oxide, and a conductive polymer.

Examples of the metal include platinum, gold, silver, copper, and aluminium.

Examples of the carbon compound include graphite, fullerene, carbon nanotubes, and graphene.

Examples of the conductive metal oxide include ITO, FTO, and ATO.

Examples of the conductive polymer include polythiophene and polyaniline.

The above-listed examples may be used alone or in combination.

The second electrode can be formed on the hole-transporting layer by an appropriate method, such as coating, laminating, vapor deposition, CVD, and bonding, depending on a material of the second electrode for use, or the hole-transporting layer for use.

Within the photoelectric conversion element, at least one of the first electrode and the second electrode is preferably substantially transparent. It is preferable that the side of the first electrode be transparent and incident light enter the photoelectric conversion element from the side of the first electrode. In this case, a material that reflects light is preferably used at the side of the second electrode. As the material that reflects light, glass or a plastic to which metal or conductive oxide is deposited through vapor deposition, or a metal thin film is preferably used. Moreover, it is also effective to dispose an anti-reflection layer at the side from which incident light enters.

<Other Members>

Other members are not particularly limited and may be appropriately selected depending on the intended purpose. Examples of such members include a hole-blocking layer, a first substrate, a second substrate, and a sealing member.

«Hole-Blocking Layer»

The hole-blocking layer may be formed between the first electrode and the electron-transporting layer. The hole-blocking layer is configured to transport electrons, which are generated by a photosensitizing compound and transported to the electron-transporting layer, to the first electrode and prevent from being in contact with the hole-transporting layer. The presence of the hole-blocking layer can suppress flow of holes into the first electrode and prevent low output caused by recombination of electrons and holes. Since a solid photoelectric conversion element to which a hole-transporting layer is disposed has high speed of recombination between holes in the hole-transporting material and electrons on a surface of the electrode compared to a fluid-type photoelectric conversion element, an effect obtainable by forming the hole-blocking layer is significant.

A material of the hole-blocking layer is not particularly limited and may be appropriately selected depending on the intended purpose, as long as the material of the hole-blocking layer is a material that is transparent to visible light and has electron transporting properties. Examples of the material of the hole-blocking layer include a single semiconductor (e.g., silicon and germanium), a compound semiconductor (e.g., chalcogenide of metal), and a compound having a perovskite structure.

Examples of the chalcogenide of metal include: oxides of titanium, tin, zinc, iron, tungsten, zirconium, hafnium, strontium, indium, cerium, yttrium, lanthanum, vanadium, niobium, and tantalum; sulfides of cadmium, zinc, lead, silver, antimony, and bismuth; selenides of cadmium and lead; and telluride of cadmium. Other examples of the compound semiconductor include: phosphides of zinc, gallium, indium, and cadmium; gallium arsenide; copper-indium-selenide; and copper-indium-sulfide.

Examples of the compound having a perovskite structure include strontium titanate, calcium titanate, sodium titanate, barium titanate, and potassium niobate.

Among the above-listed examples, oxide semiconductors are preferable, titanium oxide, niobium oxide, magnesium oxide, aluminium oxide, zinc oxide, tungsten oxide, and tin oxide are more preferable, and titanium oxide is even more preferable.

The above-listed examples may be used alone or in combination. The above-listed materials may be used as a single layer or a laminate. Moreover, a crystal structure of any of the above-listed semiconductors is not particularly limited and may be appropriately selected depending on the intended purpose. The crystal structure thereof may be a single crystal, polycrystalline, or amorphous.

A film forming method of the hole-blocking layer is not particularly limited and may be appropriately selected depending on the intended purpose. Examples of the film forming method of the hole-blocking layer include a sol-gel method that is wet film formation, a hydrolysis method from titanium tetrachloride, and sputtering that is dry film formation. Among the above-listed examples, sputtering is preferable. When the film forming method of the hole-blocking layer is sputtering, a film density can be made sufficiently high and current loss can be suppressed.

A film thickness of the hole-blocking layer is not particularly limited and may be appropriately selected depending on the intended purpose. The film thickness of the hole-blocking layer is preferably 5 nm or greater but 1 µm or less. In case of a film formed by a wet system, the film thickness is more preferably 500 nm or greater but 700 nm or less. In case of a film formed by a dry system, the film thickness is more preferably 5 nm or greater but 30 nm or less.

«First Substrate»

A shape, structure, and size of the first substrate are not particularly limited and may be appropriately selected depending on the intended purpose.

The material of the first substrate is not particularly limited and may be appropriately selected depending on the intended purpose, as long as the material is a material having translucency and insulation. Examples of the material include substrates, such as glass, plastic films, and ceramics. Among the above-listed example, a substrate having heat resistance against a firing temperature is preferable in the case where a step of firing is included at the time when an electron-transporting layer is formed as described below. Moreover, the first substrate is preferably a substrate having flexibility.

«Second Substrate»

The second substrate is not particularly limited and any of substrates known in the art can be used. Examples thereof include substrates, such as glass, plastic films, and ceramics. A convex-concave part may be formed at a contact area of the second substrate with a sealing member in order to increase adhesion between the second substrate and the sealing member.

A formation method of the convex-concave part is not particularly limited and may be appropriately selected depending on the intended purpose. Examples of the formation method include sand blasting, water blasting, polishing with sand paper, chemical etching, and laser processing.

As a method for increasing adhesion between the second substrate and the sealing member, for example, organic matter on a surface thereof may be removed or hydrophilicity of the surface thereof may be improved. A method for removing organic matter on a surface of the second substrate is not particularly limited and may be appropriately selected depending on the intended purpose. Examples of the method include UV ozone washing and an oxygen plasma treatment.

«Sealing Member»

Examples of a sealing resin include an acrylic resin and an epoxy resin.

As a cured product of an acrylic resin, any material known in the art can be used as long as the material is a product obtained by curing monomers or oligomers each including an acryl group in a molecule thereof.

As a cured product of an epoxy resin, any material known in the art can be used as long as the material is a product obtained by curing monomers or oligomers each including an epoxy group in a molecule thereof.

Examples of the epoxy resin include a water-dispersing epoxy resin, a non-solvent epoxy resin, a solid epoxy resin, a heat-curable epoxy resin, a curing agent-mixed epoxy resin, and an ultraviolet ray-curable epoxy resin. Among the above-listed examples, a heat-curable epoxy resin and an ultraviolet ray-curable epoxy resin are preferable, and an ultraviolet ray-curable epoxy resin is more preferable. Note that, heating may be performed even on an ultraviolet ray-curable resin. It is preferable that heating be performed even after the ultraviolet ray curing.

Examples of the epoxy resin include a bisphenol A-based epoxy resin, a bisphenol F-based epoxy resin, a novolac-based epoxy resin, a alicydic epoxy resin, a long-chain aliphatic epoxy resin, a glycidyl amine-based epoxy resin, a glycidyl ether-based epoxy resin, and a glycidyl ester-based epoxy resin. The above-listed examples may be used alone or in combination.

The epoxy resin is preferably mixed with a curing agent or various additives according to the necessity.

The curing agent is classified into an amine-based curing agent, an acid anhydride-based curing agent, a polyamide-based curing agent, and other curing agents. The curing agent is appropriately selected depending on the intended purpose.

Examples of the amine-based curing agent include: aliphatic polyamine, such as diethylenetriamine and triethylenetetramine; and aromatic polyamine, such as methphenylenediamine, diaminodiphenylmethane, and diaminodiphenylsulfone.

Examples of the acid anhydride-based curing agent include phthalic anhydride, tetra or hexahydrophthalic anhydride, methyltetrahydrophthalic anhydride, methylnadic anhydride, pyromellitic anhydride, HET anhydride, and dodecenylsuccinic anhydride.

Examples of other curing agents include imidazoles and polymercaptan. The above-listed examples may be used alone or in combination.

Examples of the additives include fillers, a gap agent, a polymerization initiator, a desiccant (dehumidifying agent), a curing accelerator, a coupling agent, a flexibilizer, a colorant, a flame retardant auxiliary, an antioxidant, and an organic solvent. Among the above-listed examples, fillers, a gap agent, a curing accelerator, a polymerization initiator, and a desiccant (dehumidifying agent) are preferable, and fillers and a polymerization initiator are more preferable.

As well as that the fillers are effective for suppressing entry of moisture or oxygen, the fillers are particularly effective because the fillers can impart an effect of reducing volume contraction during curing, an amount of outgas at the time of curing or heating, improving mechanical strength, and controlling heat transmittance or fluidity, and the fillers can maintain stable output in various environments. Particularly, the output properties or durability of the photoelectric conversion element is not only influenced by moisture or oxygen enters the photoelectric conversion element but also outgas generated during curing of the sealing member or heating. Particularly, the outgas generated during heating significantly affects output properties when the photoelectric conversion element is stored in a high temperature environment.

In this case, entry of moisture or oxygen can be suppressed by adding fillers, a gap agent, or a desiccant into the sealing member, and therefore an amount of the sealing member for use can be reduced to thereby obtain an effect of reducing outgas. Use of such additives is effective not only at the time of curing but also when a photoelectric conversion element is stored in a high temperature environment.

The fillers are not particularly limited and any of fillers known in the art can be used as the fillers. For example, inorganic fillers, such as crystalline or irregular silica, talc, alumina, aluminium nitrate, calcium silicate, and calcium carbonate, are preferably used. The above-listed examples may be used alone or in combination. An average primary particle diameter of the fillers is preferably 0.1 µm or greater but 10 µm or less, more preferably 1 µm or greater but 5 µm or less. When the average primary particle diameter is within the above-mentioned preferable range, an effect of suppressing entry of moisture or oxygen can be sufficiently obtained, an appropriate viscosity is obtained, adhesion with a substrate or defoaming is improved, and it is effective for controlling a width of a sealing part or workability.

An amount of the fillers is preferably 10 parts by mass or greater but 90 parts by mass or less, and more preferably 20 parts by mass or greater but 70 parts by mass or less, relative to 100 parts by mass of a total amount of the sealing member. When the amount of the filler is within the above-mentioned range, an effect of suppressing entry of moisture or oxygen can be sufficiently obtained, an appropriate viscosity is obtained, and excellent adhesion and workability can be obtained.

The gap agent is also called a gap controlling agent or a spacing agent, and is configured to control a gap of the sealing part. When a sealing member is applied onto a first substrate of a first electrode and a second substrate is placed thereon to seal, for example, a gap of a sealing part is matched with a size of a gap agent because the gap agent is mixed with the epoxy resin, and therefore the gap of the sealing part can be easily controlled.

As the gap agent, any of materials known in the art can be used as long as the gap agent is a particulate material having a uniform particle size and having high solvent resistance and heat resistance. The gap agent is preferably a material which has high affinity to the epoxy resin and is in the shape of particles that are spheres. Specific examples of the gap agent include glass beads, silica particles, and organic resin particles. The above-listed examples may be used alone or in combination.

A particle size of the gap agent can be selected depending on a gap of a sealing part to be set. The particle size thereof is preferably 1 µm or greater but 100 µm or less, and more preferably 5 µm or greater but 50 µm or less.

The polymerization initiator is a material that is added for the purpose of initiating polymerization using heat or light.

The thermal polymerization initiator is a compound that generates an active species, such as radicals and cations, upon heating. As the thermal polymerization initiator, specifically, an azo compound, such as 2,2'-azobisbutyronitrile (AIBN), or peroxide, such as benzoyl peroxide (BPO) is used. As the thermal cationic polymerization initiator, benzenesulfonic acid ester, or alkyl sulfonium salt is used. As the photopolymerization initiator, a photo cationic polymerization initiator is preferably used for the epoxy resin.

When the photo cationic polymerization initiator is mixed with the epoxy resin and light irradiation is performed, the photo cationic polymerization initiator is decomposed to generate strong acid, and the acid induces polymerization of the epoxy resin to proceed a curing reaction. The photo cationic polymerization initiator has effects that a volume contraction during curing is small, oxygen inhibition does not occur, and storage stability is high.

Examples of the photo cationic polymerization initiator include an aromatic diazonium salt, an aromatic iodonium salt, an aromatic sulfonium salt, a metallocene compound, and a silanol-aluminium complex.

Moreover, a photoacid generator having a function of generating acid upon irradiation of light can be also used. The photoacid generator functions as an acid for initiating cationic polymerization. Examples of the photoacid generator include onium salts, such as an ionic sulfonium salt-based photoacid generator made up of a cation part and an anionic part and an ionic part, and an ionic iodonium salt made up of a cation part and an anionic part. The above-listed examples may be used alone or in combination.

An amount of the polymerization initiator may vary depending on a material for use, but the amount thereof is preferably 0.5 parts by mass or greater but 10 parts by mass, more preferably 1 part by mass or greater but 5 parts by mass or less, relative to 100 parts by mass of a total amount of the sealing member. The polymerization initiator added in the amount within the above-mentioned range is effective because curing is appropriately progressed, an amount of uncured resides can be reduced, and an excessive amount of gas generated can be prevented.

The desiccant is also called a dehumidifying agent and is a material having a function of physically or chemically adsorbing or absorbing moisture. There is a case where humidity resistance is further enhanced or an influence of outgassing may be reduced by adding the desiccant to the sealing member. Therefore, use of the desiccant is effective.

The desiccant is preferably a particulate material. Examples of the desiccant include inorganic water-absorbing materials, such as calcium oxide, barium oxide, magnesium oxide, magnesium sulfate, sodium sulfate, calcium chloride, silica gel, molecular sieve, and zeolite. Among the above-listed examples, zeolite is preferable because zeolite has a large amount of moisture absorption. The above-listed examples may be used alone or in combination.

The curing accelerator is also called a curing catalyst and is used for the purpose of accelerating curing speed. The curing accelerator is mainly used for a heat curable epoxy resin.

Examples of the curing accelerator include: tertiary amine or tertiary amine salts, such as 1,8-diazabicyclo(5,4,0)-undec-7-ene (DSU) and 1,5-bicyclo(4,3,0)-non-5-ene (DBN); imidazole-based curing accelerators, such as 1-cyanoethyl-2-ethyl-4-methylimidazole and 2-ethyl-4-methylimidazole; and phofine or phosphonium salts, such as triphenylphosphine and tetraphenylphosphonium tetraphenylborate. The above-listed examples may be used alone or in combination.

The coupling agent has an effect of increasing molecular binding force. Examples of the coupling agent include a silane coupling agent. Examples of the coupling agent include: silane coupling agents, such as
3-glycidoxypropyltrimethoxysilane,
3-glycidoxypropylmethyldimethoxysilane,
3-glycidoxypropylmethyldimethoxysilane,
2-(3,4-epoxycyclohexyl)ethyltrimethoxysilane,
N-phenyl-gamma-aminopropyltrimethoxysilane, N-(2-aminoethyl)3-aminopropylmethyldimethoxysilane,
N-(2-aminoethyl)3-aminopropylmethyltrimethoxysilane,
3-aminopropyltriethoxysilane, 3-mercaptopropyltrimethoxysilane, vinyltrimethoxysilane,
N-(2-(vinylbenzylamino)ethyl)3-aminopropyltrimethoxysilane hydrochloride, and 3-methacryloxypropyltrimethoxysilane. The above-listed examples may be used alone or in combination.

As the sealing member, moreover, an epoxy resin composition that is commercially available as an encapsulant, a sealing material, or an adhesive has been known, and such commercial products can be used in the present disclosure. Among such commercial products, there are epoxy resin compositions that are developed and commercially available for use in solar cells or organic EL elements, and such commercial products are particularly effectively used in the present disclosure. Examples of the commercial products include: TB3118, TB3114, TB3124, and TB3125F (available from ThreeBond); WorldRock5910, WorldRock5920, and WorldRock8723 (available from Kyoritsu Chemical Co., Ltd.); and WB90US(P) (available from MORESCO Corporation).

A sheet-shaped sealing material may be also used in the present disclosure.

The sheet-shaped sealing material is a product where an epoxy resin layer is formed on a sheet in advance. As the sheet, glass or a film having high gas barrier properties may be used. The sheet corresponds to a second substrate in the present disclosure. The sealing member and the second substrate can be formed at once by bonding the sheet-shaped sealing member onto the second substrate and curing the epoxy resin layer. A structure where a void space is disposed can be formed by the formation pattern of the epoxy resin layer formed on the sheet and therefore use of such a sheet-shaped sealing material is effective.

A formation method of the sealing member is not particularly limited and can be performed according to any of methods known in the art. For example, various methods, such as dispensing, wire bar coating, spin coating, roller coating, blade coating, gravure coating, relief printing, offset printing, intaglio printing, rubber plate printing, and screen printing, can be used.

Moreover, a passivation layer may be disposed between the sealing member and the second electrode. The passivation layer is not particularly limited as long as the passivation layer is disposed in a manner that the sealing member is not in contact with the second electrode, and the passivation layer may be appropriately selected depending on the intended purpose. As the passivation layer, aluminium oxide, silicon nitride, or silicon oxide is preferably used.

Embodiments of the present disclosure will be described with reference to drawings. Throughout the drawings, the same reference is given to the same constitutional unit. The duplicated descriptions may be omitted.

<Structure of Element>

FIGS. 1, 2, and 3 are as described above, and therefore descriptions thereof are omitted.

Note that, the photoelectric conversion element illustrated in FIG. 1 includes a void space between the second electrode 7 and the second substrate 9. The presence of the void space has an advantage that a moisture content or oxygen concentration inside the void space can be controlled, and power generation performance and durability thereof can be improved. Since the second electrode 7 and the second substrate 9 are not in contact with each other, moreover, peeling or breakage of the second electrode 7 can be prevented. The oxygen concentration inside the void space is not particularly limited and may be freely selected. The oxygen concentration is preferably 0% or greater but 21% or less, more preferably 0.05% or greater but 10% or less, and even more preferably 0.1% or greater but 5% or less. Moreover, the first electrode 2 and the second electrode 7 each have a path that conducts to each of electrode extraction terminals.

Figure 4:
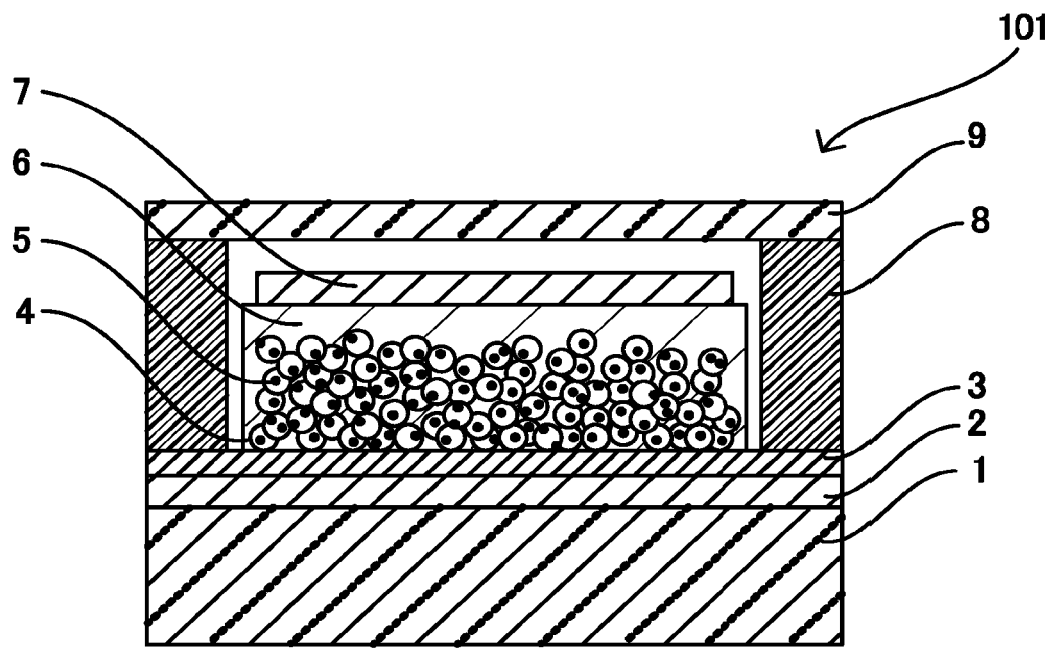
FIG. 4 is a schematic view illustrating another example of the photoelectric conversion element of the present disclosure.

FIG. 4 is a schematic view illustrating another example of the photoelectric conversion element of the present disclosure and illustrates an example where a hole-blocking layer 3 is formed between the first substrate 1 and the electron-transporting layer 4. Since the hole-blocking layer 3 is formed, recombination of electrons and holes can be prevented and therefore the hole-blocking layer is effective for improving power generation performance. The photoelectric conversion element illustrated in FIG. 4 has a void space between the second electrode 7 and the second substrate 9 similarly to FIG. 1.

Figure 5:
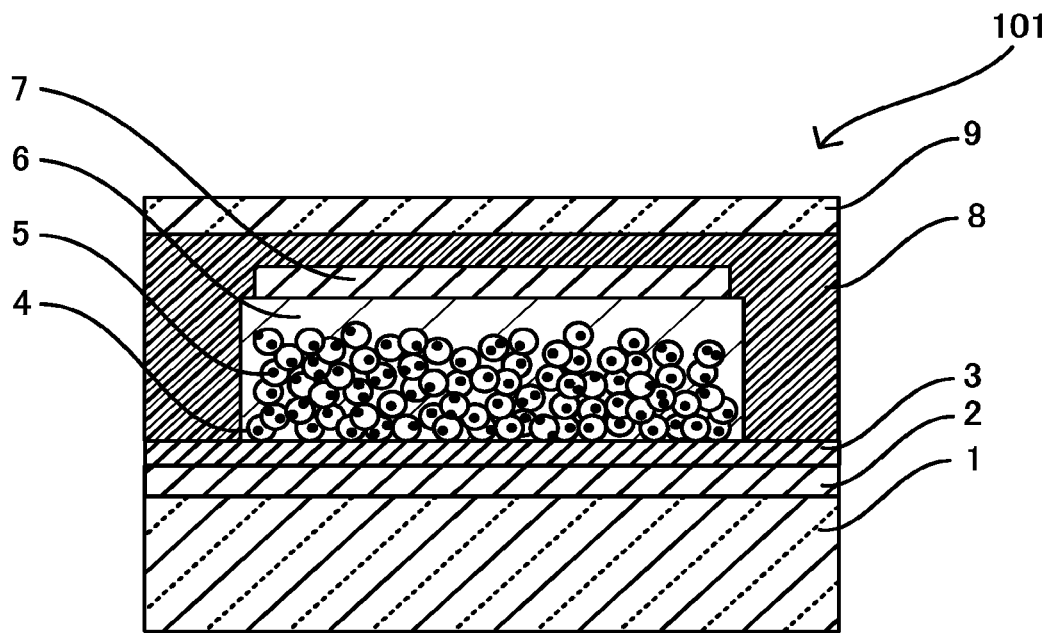
FIG. 5 is a schematic view illustrating another example of the photoelectric conversion element of the present disclosure.

FIG. 5 is a schematic view illustrating another example of the photoelectric conversion element of the present disclosure, and illustrates an example where a void space of a sealing part is not disposed and the void space of FIG. 4 is filled with the sealing member 8. For example, the photoelectric conversion element can be formed by a method where the sealing member 8 is applied onto an entire surface of the second electrode 7 and the second substrate 9 is disposed thereon, or a method using the above-mentioned sheet-shaped sealing material. In this case, the void space inside the sealing may be completely removed, or may be partially left. Since almost the entire surface is covered with the sealing material, the peeling or breakage of the second substrate 9 can be reduced, and therefore mechanical strength of the photoelectric conversion element can be enhanced.

Figure 6:
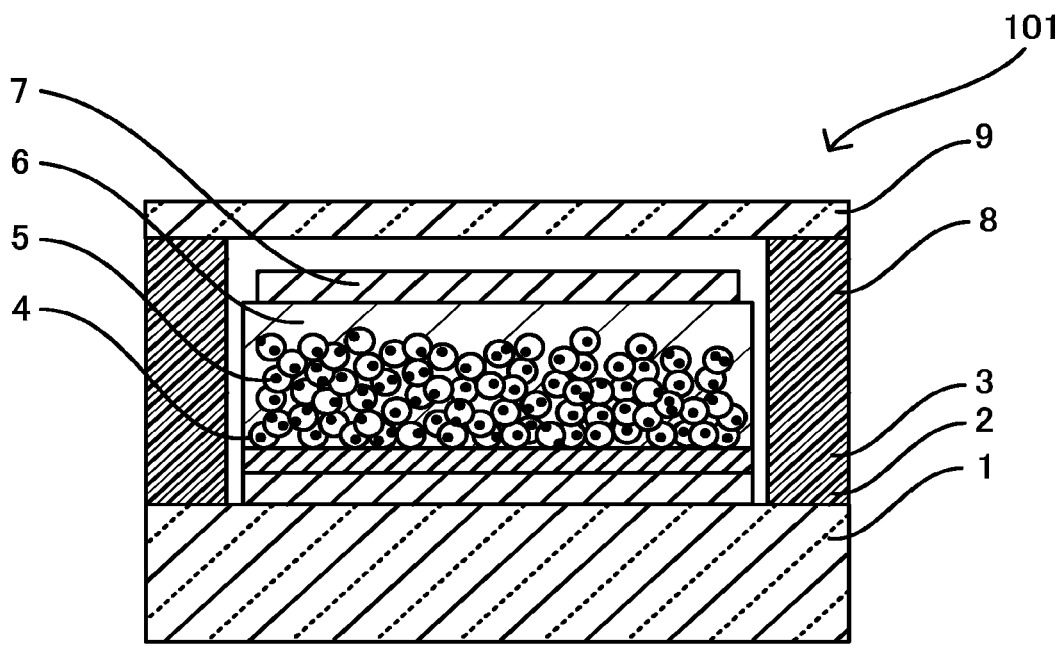
FIG. 6 is a schematic view illustrating another example of the photoelectric conversion element of the present disclosure.

FIG. 6 is a schematic view illustrating another example of the photoelectric conversion element of the present disclosure and illustrates an example where the sealing member 8 is bonded to the first substrate 1 and the second substrate 9. Since the photoelectric conversion element has the above-described structure, the adhesion of the sealing member 8 to the substrate becomes high, and therefore an effect of enhancing a mechanical strength of the photoelectric conversion element is obtained. Since the adhesion increases, a sealing effect of preventing entry of moisture or oxygen can be further enhanced.

Figure 7:
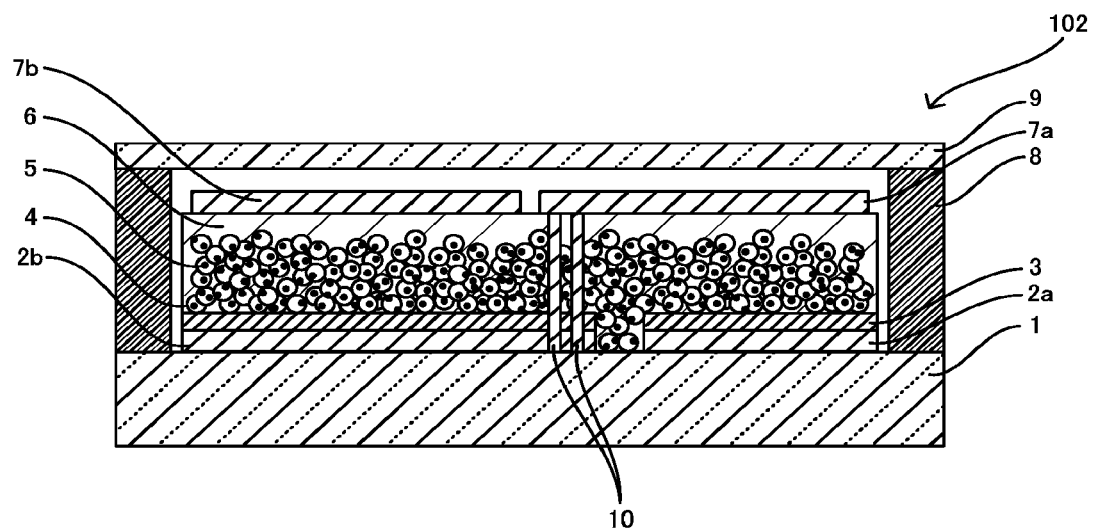
FIG. 7 is a schematic view illustrating an example of a photoelectric conversion element module of the present disclosure.

FIG. 7 is a schematic view illustrating an example of the photoelectric conversion element module of the present disclosure, and illustrates an example of the photoelectric conversion element module where a plurality of photoelectric conversion elements are included and the photoelectric conversion elements are connected in series. In the example of FIG. 7, a penetration part 10 is formed after forming a hole-transporting layer 6, and then, a second electrode 7 is formed to introduce a material of the second electrode into the penetration part 10, to thereby electrically conduct with the first electrode 2b of the adjacent cell. Although they are not illustrated in FIG. 7, the first electrode 2a and the second electrode 7b each have a path that conducts to each of output extraction terminals.

As illustrated in FIG. 3, the area the projected parts occupying the surface of the hole-transporting layer 6 of the photoelectric conversion element module 102 of FIG. 7 is small and there is no point at which electric current is relatively concentrated, and therefore occurrence of electric current leakage can be prevented. In the photoelectric conversion element module 102, moreover, the hole-transporting layers 6 within at least two adjacent photoelectric conversion elements are linked without linking the hole-blocking layers 3. Since the photoelectric conversion module 102 has the above-described structure, the photoelectric conversion element module 102 does not easily cause electric current leakage with high illuminance light, and the photosensitizing compound thereof is not easily damaged, and therefore reduction in output with low illuminance light before and after being exposed to high illuminance light can be prevented. Therefore, the photoelectric conversion element module 102 has high power generation output with light of lighting equipment used indoor, such as LED and a fluorescent lamp, even after being exposed to sun light.

Note that, the penetration part 10 may penetrate through the first electrode 2 to reach the first substrate 1, or may not reach the first substrate 1 by stopping the processing at the inner part of the first electrode 2. In the case where a shape of the penetration part 10 is a fine hole that passes through the first electrode 2 to reach the first substrate 1, a film cross-sectional area of the first electrode 2 reduces as a total opening area of the fine hole is too large relative to area of the penetration part 10, and therefore a resistance value increases and reduction of a photoelectric conversion efficiency may be caused. Therefore, a ratio of the total opening area of the fine hole to the area of the penetration part 10 is preferably from 5/100 through 60/100.

Examples of a formation method of the penetration part 10 include sand blasting, water blasting, polishing with sand paper, chemical etching, and laser processing. In the present disclosure, laser processing is preferable. The reason thereof is because a fine hole can be formed without using sand, etching, or a resist, and moreover a process can be performed cleanly with good reproducibility. Another reason why laser processing is preferable is that at least one of, or all of in some cases, the hole-blocking layer 3, the electron-transporting layer 4, the hole-transporting layer 6, and the second electrode 7 can be removed by impact peeling through laser processing, when the penetration part 10 is formed. As a result, it is not necessary to dispose a mask at the time of laminating, and removal and formation of the fine penetration part 10 can be easily performed at once.

Figure 8:
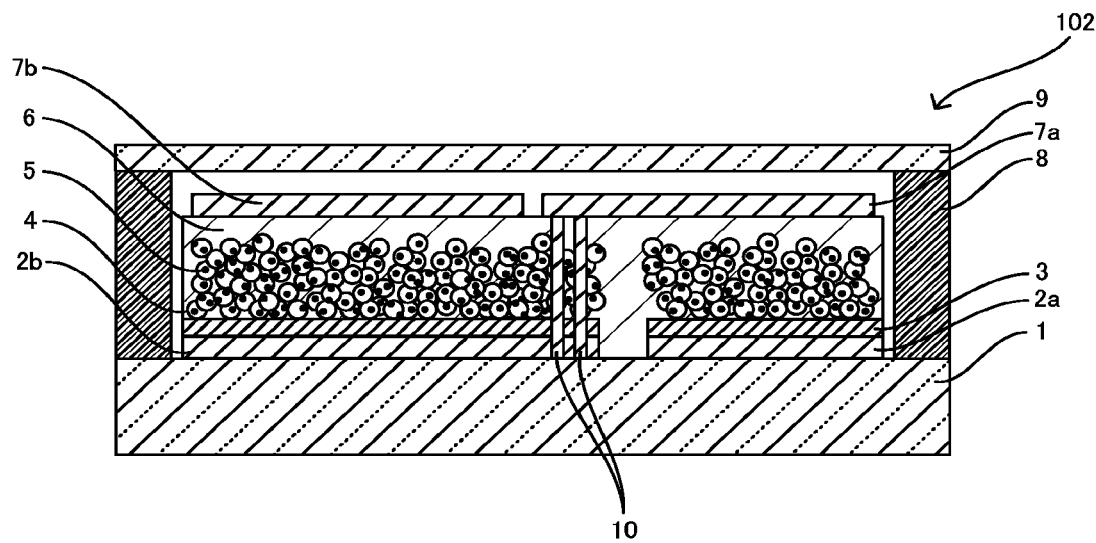
FIG. 8 is a schematic view illustrating another example of the photoelectric conversion element module of the present disclosure.

FIG. 8 is a schematic view illustrating an example of the photoelectric conversion element module of the present disclosure, and illustrates an example having a layer structure where the electron-transporting layers 4 of adjacent photoelectric conversion elements are separated and are independent, unlike the example of FIG. 7. Since the photoelectric conversion element module 102 illustrated in FIG. 8 has the above-described structure, the electron-transporting layers 4 are not extended to each other to reduce electron diffusion, and therefore electric current leakage is reduced and light resistance is improved. Accordingly, the photoelectric conversion element module 102 illustrated in FIG. 8 is advantageous.

Figure 9:
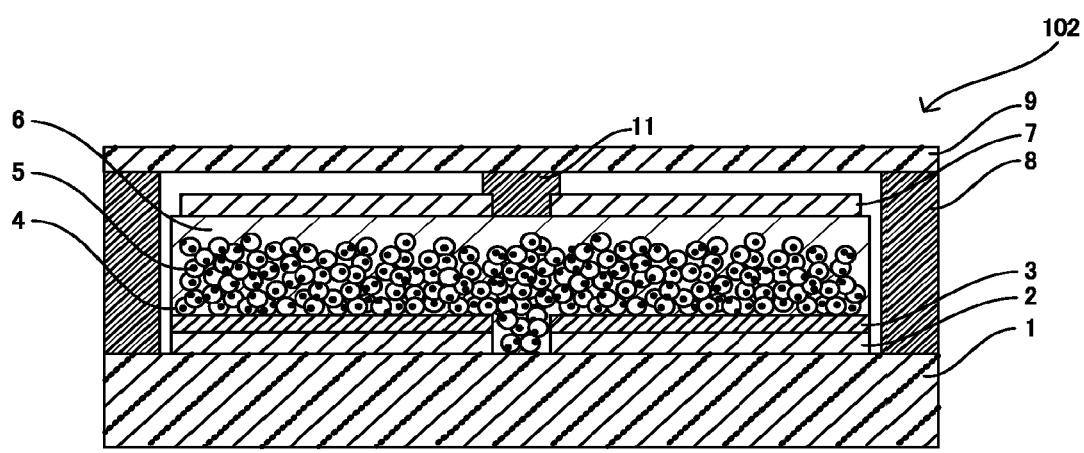
FIG. 9 is a schematic view illustrating another example of the photoelectric conversion element module of the present disclosure.

FIG. 9 is a schematic view illustrating an example of the photoelectric conversion element module of the present disclosure, and illustrates an example of the photoelectric conversion element module where the photoelectric conversion element module includes a plurality of photoelectric conversion elements connected in series and a sealing member like a beam is disposed in a void space between cells. When a void space is disposed between the second electrode 7 and the second substrate 9 as in FIG. 4, peeling or breakage of the second electrode 7 can be prevented, but mechanical strength of sealing may reduce. In the case where the space between the second electrode 7 and the second substrate 9 is filled with the sealing member as in FIG. 5, on the other hand, mechanical strength of sealing increases, but peeling of the second electrode 7 may be caused. In order to increase electric power generation, an increase in an area of the photoelectric conversion element module is effective. However, reduction of mechanical strength cannot be avoided when the photoelectric conversion element module includes a void space. Therefore, peeling or breakage of the second substrate 9 can be prevented and mechanical strength of sealing can be increased by disposing the sealing member like a beam as illustrated in FIG. 9.

The photoelectric conversion element and photoelectric conversion element module of the present disclosure can be applied for a power supply device by combining with a circuit board configured to control generated electric current. Examples of devices using the power supply device include electronic desk calculators and watches. Other than the examples just listed, a power supply device including the photoelectric conversion element of the present disclosure can be applied for mobile phones, electronic organizers, and electronic paper. Moreover, a power supply device including the photoelectric conversion element can be used as an auxiliary power supply for prolonging a continuous use time of a charge-type or a dry cell-type of an electrical appliance.

(Electronic Device)

An electronic device of the present disclosure includes the photoelectric conversion element and/or photoelectric conversion element module of the present disclosure and a device that is driven by electric power generated through photoelectric conversion performed by the photoelectric conversion element and/or photoelectric conversion element module. The electronic device may further include other devices according to the necessity.

(Power Supply Module)

The power supply module of the present disclosure includes the photoelectric conversion element and/or photoelectric conversion element module of the present disclosure and a power supply integrated circuit (IC), and may further includes other devices according to the necessity.

Next, specific embodiments of the electronic device including the photoelectric conversion element or the photoelectric conversion element module and a device that is driven by electricity generated by the photoelectric conversion element or the photoelectric conversion element module will be described.

Figure 10:
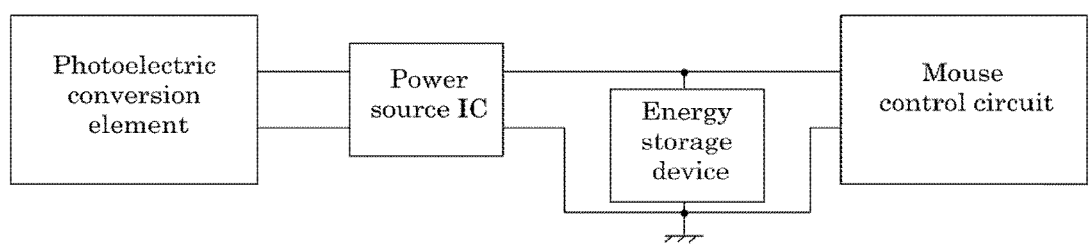
FIG. 10 is a block diagram of a mouse for a personal computer as an example of an electronic device of the present disclosure.

FIG. 10 is a block diagram of a mouse for a personal computer as an example of the electronic device of the present disclosure.

As illustrated in FIG. 10, the photoelectric conversion element or photoelectric conversion element module and a power supply IC and moreover an energy storage device are combined and electricity is supplied to a power supply of a control circuit of the mouse. As a result, the electricity is charged in the energy storage device when the mouse is not used, and the mouse can be driven by the electricity, and therefore the mouse that does not require wiring or replacement a battery can be obtained. Since a battery is not required, moreover, a weight thereof can be reduced and therefore it is effective.

Figure 11:
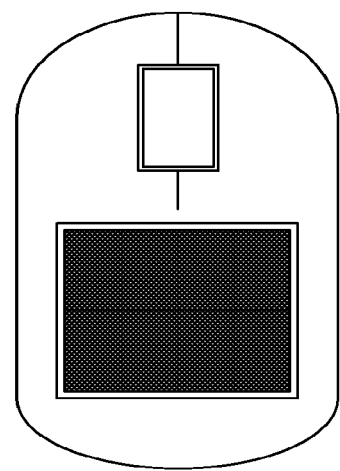
FIG. 11 is a schematic external view illustrating an example of the mouse illustrated in FIG. 10.

FIG. 11 is a schematic external view illustrating an example of the mouse illustrated in FIG. 10.

As illustrated in FIG. 11, the photoelectric conversion element, the power supply IC, and the energy storage device are mounted inside the mouse, but an upper part of the photoelectric conversion element is covered with a transparent housing to allow light to reach the photoelectric conversion element. Moreover, a whole housing of the mouse can be formed of a transparent resin. The arrangement of the photoelectric conversion element is not limited to the example as mentioned above. For example, the photoelectric conversion element may be arranged in a position to which light is applied even when the mouse is covered with a hand, and such an arrangement may be preferable.

Next, other embodiments of the photoelectric conversion element and photoelectric conversion element module of the present disclosure and an electronic device having a device driven by electric power generated by the photoelectric conversion element and photoelectric conversion element module will be described.

Figure 12:
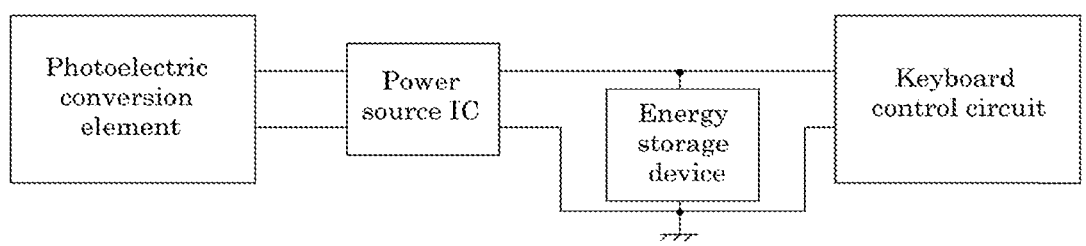
FIG. 12 is a block diagram of a keyboard for a personal computer as an example of the electronic device of the present disclosure.

FIG. 12 is a block view of a keyboard for a personal computer as an example of the electronic device of the present disclosure.

As illustrated in FIG. 12, the photoelectric conversion element, a power supply IC, and an energy storage device are combined, and electricity supplied is connected to a power supply of a control circuit of the keyboard. As a result, electricity is charged in the energy storage device when the keyboard is not used, and the keyboard can be driven by the electricity, and therefore the keyboard that does not require wiring or replacement of a battery can be obtained. Since a battery is not required, moreover, a weight thereof can be reduced and therefore it is effective.

Figure 13:
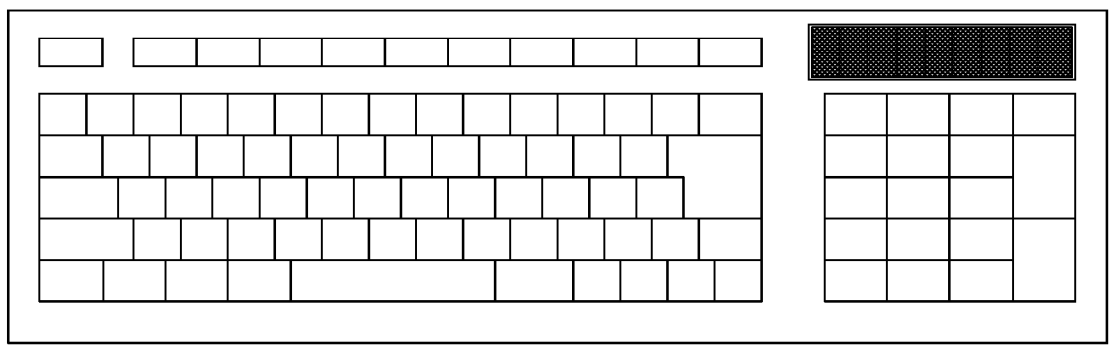
FIG. 13 is a schematic external view illustrating an example of the keyboard illustrated in FIG. 12.

FIG. 13 is a schematic external view illustrating an example of the keyboard illustrated in FIG. 12.

As illustrated in FIG. 13, the photoelectric conversion element, the power supply IC, and the energy storage device are mounted inside the keyboard, but an upper part of the photoelectric conversion element is covered with a transparent housing to allow light to reach the photoelectric conversion element. A whole housing of the keyboard can be formed of a transparent resin. The arrangement of the photoelectric conversion element is not limited to the example as mentioned above.

Figure 14:
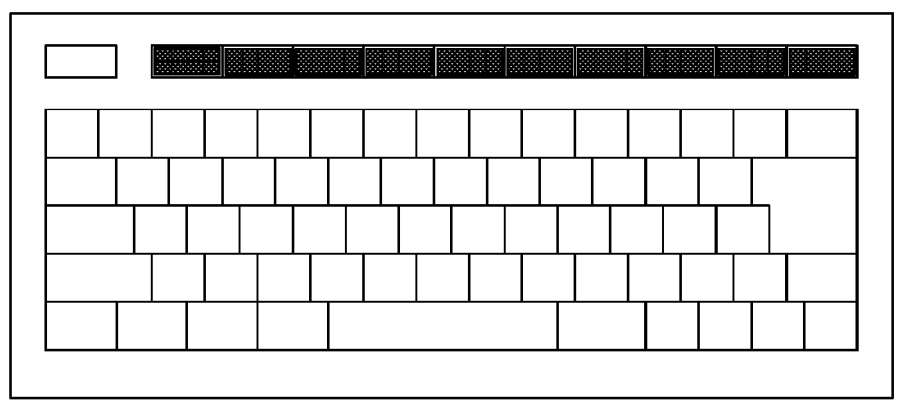
FIG. 14 is a schematic external view illustrating another example of the keyboard illustrated in FIG. 12.

In case of a small keyboard having a small space into which the photoelectric conversion element is disposed, as illustrated in FIG. 14, a small photoelectric conversion element may be embedded in part of the key, and such an arrangement may be effective.

Next, another embodiment of the photoelectric conversion element and photoelectric conversion element module of the present disclosure and an electronic device having a device driven by electric power generated by the photoelectric conversion element and photoelectric conversion element module will be described.

Figure 15:
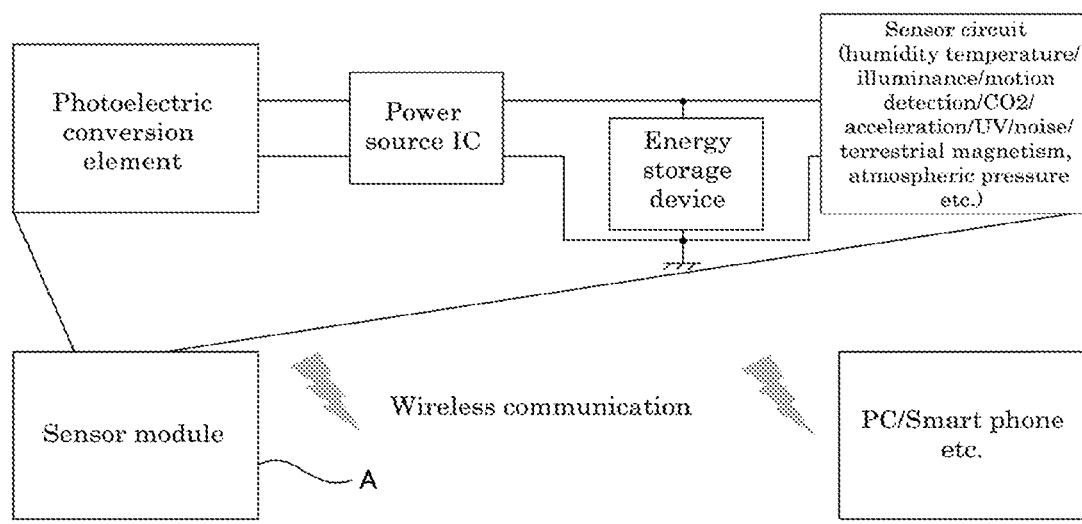
FIG. 15 is a block diagram of a sensor as an example of the electronic device of the present disclosure.

FIG. 15 is a block diagram of a sensor as an example of the electronic device of the present disclosure.

As illustrated in FIG. 15, the photoelectric conversion element, a power supply IC, and an energy storage device are combined, and electricity supplied is connected to a power supply of a sensor circuit. As a result, a sensor module can be constituted without connecting an external power supply and without replacing a battery. A sensing target is a temperature and humidity, illuminance, motion detector, $CO_2$, acceleration, UV, noise, terrestrial magnetism, atmospheric pressure, etc., and such an electronic device can be applied for various sensors and effective. As illustrated with A in FIG. 15, the sensor module is configured to sense a measuring target on a periodic bases and transmit the read data to a personal computer (PC) or a smartphone through wireless communication.

It is expected that use of sensors is getting significantly increased as the internet of things (IoT) society is realized. Replacing batteries of numeral sensors is time consuming and is not realistic. Moreover, the fact that a sensor is generally installed in a position where it is difficult to replace a battery, such as a ceiling and a wall, also makes workability bad. It is also significant advantage that electricity can be supplied by the photoelectric conversion element. Moreover, an advantage that freedom in an arrangement is high can be obtained as the photoelectric conversion element can obtain high output even with low illuminance light and the output thereof has less dependency to an incident angle of light.

Next, another embodiment of the photoelectric conversion element and photoelectric conversion element module of the present disclosure and an electronic device having a device driven by electric power generated by the photoelectric conversion element and photoelectric conversion element module will be described.

Figure 16:
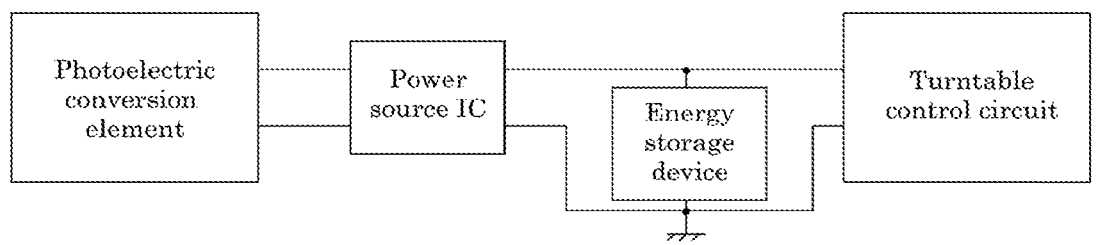
FIG. 16 is a block diagram of a turntable as an example of the electronic device of the present disclosure.

FIG. 16 is a block diagram of a turntable as an example of the electronic device of the present disclosure.

As illustrated in FIG. 16, the photoelectric conversion element, a power supply IC, and an energy storage device are combined, and electricity supplied is connected to a power supply of a turntable control circuit. As a result, a turntable can be constituted without connecting an external power supply and without replacing a battery.

The turntable is used, for example, in a display case in which products are displayed. Wiring of a power supply of the turntable degrades an appearance of the display, and moreover displayed products need to be removed when a battery of the turntable is replaced, which is time-consuming work. The above-mentioned problems can be solved by using the photoelectric conversion element of the present disclosure and therefore use thereof is effective.

<Use>

The photoelectric conversion element and photoelectric conversion element module of the present disclosure, the electronic device including a device that is driven by electricity generated by the photoelectric conversion element and photoelectric conversion element module of the present disclosure, and the power supply module have been described above. The embodiments described are only part of applicable embodiments, and use of the photoelectric conversion element or photoelectric conversion element module of the present disclosure is not limited to the above-described embodiments.

The photoelectric conversion element or photoelectric conversion element module can be applied for, for example, a power supply device by combining with a circuit board configured to control generated electricity.

Examples of devices using the power supply device include electronic desk calculators, watches, mobile phones, electronic organizers, and electronic paper.

Moreover, a power supply device including the photoelectric conversion element can be used as an auxiliary power supply for prolonging a continuous use time of a charge-type or a dry cell-type of an electrical appliance.

The photoelectric conversion element or photoelectric conversion element module of the present disclosure can function as a self-sustaining power supply, and a device can be driven by electricity generated through photoelectric conversion. Since the photoelectric conversion element and photoelectric conversion element module can generate electricity upon irradiation of light, it is not necessary to connect the electronic device with a power supply or to replace a battery. Therefore, the electronic device can be driven in a place where there is no a power supply facility, the electronic device can be worn or used mobile, and the electronic device can be driven without replacing a battery in a place where it is difficult to perform replacement of the battery. In the case where a dry cell is used, moreover, a weight of the electronic device increases by the weight of the dry cell or a size of the electronic device increases. Therefore, there may be a problem in installing the electronic device on a wall or ceiling, or transporting. Since the photoelectric conversion element and photoelectric conversion element module of the present disclosure are light and thin, there is high freedom in installing, and there is a significant advantage in wearing or carrying the electronic device.

As described above, the photoelectric conversion element and photoelectric conversion element module of the present disclosure can be used as self-sustaining power supply, and such a self-sustaining power supply can be combined with various electronic devices. For example, the self-sustaining power supply can be used in combination with a display device (e.g., an electronic desk calculator, a watch, a mobile phone, an electronic organizer, and electronic paper), an accessory device of a personal computer (e.g., a mouse and a keyboard), various sensor devices (e.g., a temperature and humidity sensor and a motion detection sensor), transmitters (e.g., a beacon and a global positioning system [GPS]), and numerous electronic devices (e.g., auxiliary lamps and remote controllers).

The photoelectric conversion element and photoelectric conversion element module of the present disclosure is widely applied because the photoelectric conversion element or photoelectric conversion element module can generate electric power particularly with low illuminance light and can generate electric power indoor, moreover in a shaded place. Moreover, the photoelectric conversion element and photoelectric conversion element module is highly safe because liquid leakage is not cause unlike a dry cell, and accidental ingestion that is often caused with a button cell does not occur. Furthermore, the photoelectric conversion element or photoelectric conversion element module can be used as an auxiliary power supply for prolonging a continuous use time of a charge-type or a dry cell-type of an electrical appliance. As described above, an electronic device that is light and easy to use, has high freedom in installing, does not require replacement of a battery, is highly safe, and is effective for reducing environmental loads can be obtained by combining the photoelectric conversion element or photoelectric conversion element module of the present disclosure with a device that can be driven by electric power generated through photoelectric conversion performed by the photoelectric conversion element or photoelectric conversion element module.

Figure 17:
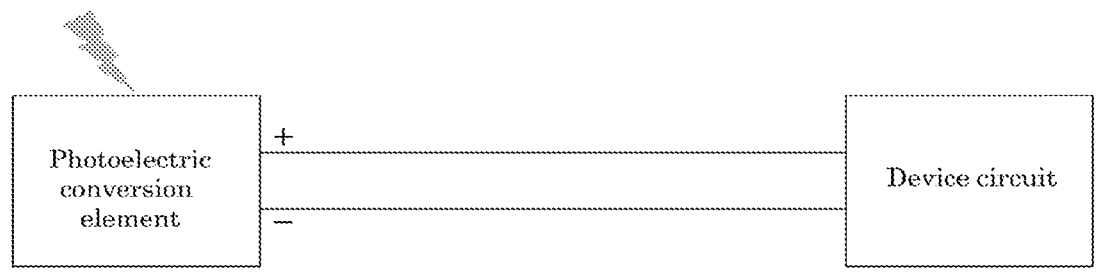
FIG. 17 is a block diagram illustrating an example of the electronic device of the present disclosure.

FIG. 17 is a block diagram illustrating an example of the electronic device of the present disclosure where the photoelectric conversion element and/or photoelectric conversion element module is combined with a device driven by electric power generated through photoelectric conversion performed by the photoelectric conversion element and/or photoelectric conversion element module. The electronic device can generate electric power as the photoelectric conversion element is irradiated with light and electric power can be extracted. The circuit of the device can be driven by the generated electric power.

Figure 18:
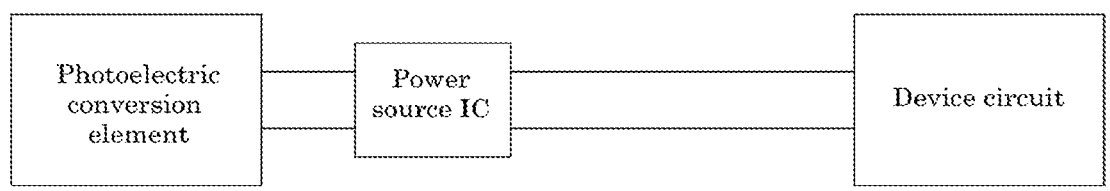
FIG. 18 is a block diagram illustrating an example where a power supply IC is further mounted in the electronic device illustrated in FIG. 17.

Since output of the photoelectric conversion element varies depending on illuminance of the surrounding environment, there may be a case where the electronic device illustrated in FIG. 17 may not be stably driven. In this case, it is possible to embed a power supply IC for a photoelectric conversion element between the photoelectric conversion element and the circuit of the device in order to supply stable voltage to the side of the circuit as illustrated in FIG. 18, and such an arrangement is effective.

Figure 19:
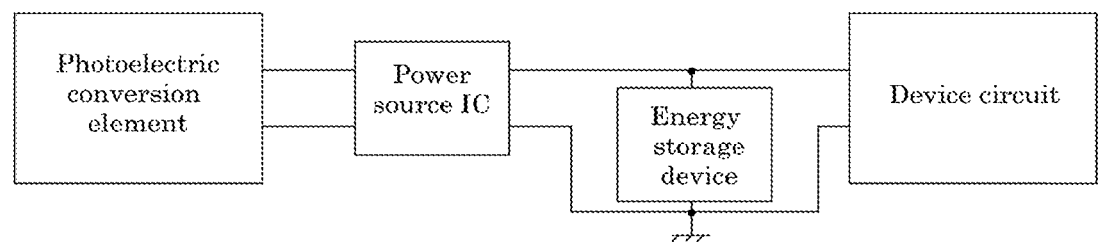
FIG. 19 is a block diagram illustrating an example where an energy storage device is further mounted in the electronic device illustrated in FIG. 18.

The photoelectric conversion element can generate electric power as long as light of sufficient illuminance is applied, but desired electric power cannot be obtained when illuminance is insufficient to generate electric power, which is a disadvantage of the photoelectric conversion element. In this case, excess electric power from the photoelectric conversion element can be stored in the energy storage device, the electric power stored in the energy storage device can be supplied to a circuit of the device even when illuminance is too low or light is not applied to the photoelectric conversion element, and the electronic device can be stably driven, by mounting the energy storage device, such as a capacitor, between a power supply IC and the circuit of the device as illustrated in FIG. 19.

As described above, the electronic device in which the photoelectric conversion element and/or photoelectric conversion element module of the present disclosure and a device circuit are combined can be driven even in an environment where a power supply is unavailable, does not require replacement of a battery, and can be stably driven by combining with a power supply IC or an energy storage device. In this manner, advantages of the photoelectric conversion element can be maximized.

Figure 20:
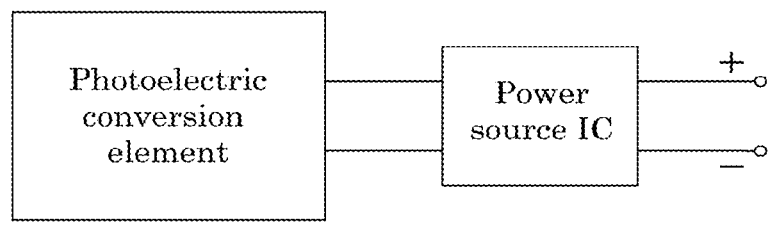
FIG. 20 is a block diagram illustrating an example of a power supply module of the present disclosure.

Meanwhile, the photoelectric conversion element and/or photoelectric conversion element module of the present disclosure can be also used as a power supply module, and such use is effective. As illustrated in FIG. 20, for example, a DC power supply module capable of supplying electric power generated through photoelectric conversion performed by the photoelectric conversion element to a power supply IC for a photoelectric conversion element at a constant voltage level by connecting the photoelectric conversion element and/or photoelectric conversion element module of the present disclosure to the power supply IC for the photoelectric conversion element.

Figure 21:
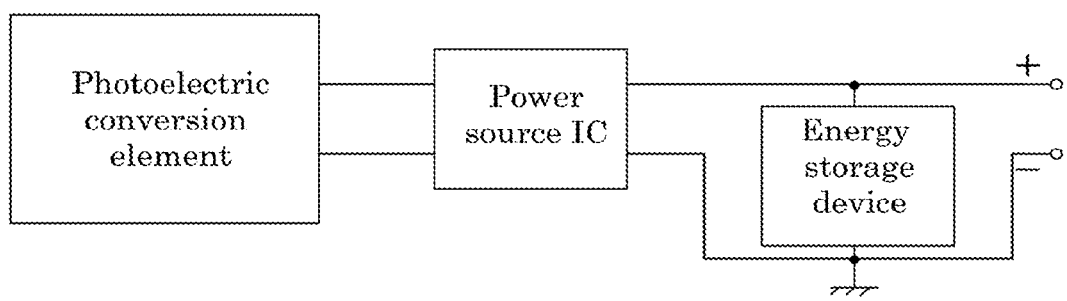
FIG. 21 is a block diagram illustrating an example where an energy storage device is further mounted in the power supply module illustrated in FIG. 20.

By adding an energy storage device to the power supply IC as illustrated in FIG. 21, moreover, electric power generated by the photoelectric conversion element can be stored in the energy storage device. Therefore, a power supply module to which electric power can be supplied even when illuminance is too low or light is not applied to the photoelectric conversion element can be composed.

The power supply modules of the present disclosure illustrated in FIG. 20 and FIG. 21 can be used as a power supply module without replacing a battery as in case of primary cells known in the art.

EXAMPLES

The present disclosure will be described more specifically below by way of Examples and Comparative Examples. The present disclosure should not be construed as being limited to these Examples.

Example 1

<Production of Photoelectric Conversion Element Module>
On a glass substrate serving as a first substrate, a film of indium-doped tin oxide (ITO) and a film of niobium-doped tin oxide (NTO) were sequentially formed as a first electrode by sputtering. Subsequently, a dense layer formed of titanium oxide was formed as a hole-blocking layer by reactive sputtering with oxygen gas. Next, etching was performed on part of the ITO/NTO and hole-blocking layer formed on the substrate through laser processing, to arrange a distance between adjacent photoelectric conversion elements to 10 µm.

Next, 3 g of titanium oxide (ST-21, available from ISHIHARA SANGYO KAISHA, LTD.), 0.2 g of acetyl acetone, and 0.3 g of a surfactant (polyoxyethylene octylphenyl ether, available from Wako Pure Chemical Corporation) were subjected to a bead mill treatment together with 5.5 g of water and 1.0 g of ethanol for 12 hours, to thereby obtain a titanium oxide dispersion liquid. To the obtained titanium oxide dispersion liquid, 1.2 g of polyethylene glycol (#20,000, available from Wako Pure Chemical Corporation) was added to produce a paste. The obtained paste was applied onto the hole-blocking layer in a manner that an average thickness thereof was to be about 1.5 μm. The resultant was dried at 60° C., followed by firing for 30 minutes at 550° C. in the air, to thereby form a porous electron-transporting layer.

The glass substrate on which the electron-transporting layer had been formed was immersed in a solution obtained by adding an acetonitrile/t-butanol (volume ratio 1:1) mixed liquid to 120 mg of the photosensitizing compound represented by B-5 above and 150 mg of chenodeoxycholic acid (available from Tokyo Chemical Industry Co., Ltd.) and stirring the resultant mixture, and was left to stand in the dark for 1 hour, to thereby allow the photosensitizing compound to adsorb on a surface of the electron-transporting layer.

Next, 15.0 mg of lithium bis(trifluoromethanesulfonyl)imide (available from KANTO CHEMICAL CO., LTD.) and 40 mg of the basic compound represented by C-12 above were added to and dissolved in 1 mL of a chlorobenzene solution including 183 mg of the hole-transporting material represented by D-7 above, to thereby prepare a hole-transporting layer coating liquid.

Next, the hole-transporting layer coating liquid was applied onto the electron-transporting layer on which the photosensitizing compound had been adsorbed by blade coating to form a hole-transporting layer having an average thickness of about 400 nm. Thereafter, the edges of the glass substrate to which the sealing member had been disposed was subjected to an etching treatment through laser processing to form through holes configured to connect photoelectric conversion elements in series through laser processing. Moreover, silver was deposited thereon by vacuum vapor deposition to thereby form a second electrode having an average thickness of about 60 nm. It was confirmed that the silver was deposited on inner walls of the through holes by vapor deposition to connect photoelectric conversion elements next to one another in series. The number of the formed elements connected in series was 6.

An ultraviolet ray curable resin (TB3118, available from ThreeBond Holdings Co., Ltd.) was applied by a dispenser (2300N, available from SAN-EI TECH Ltd.) to the edge of the glass substrate to surround a power generation region. Thereafter, the resultant was transferred into a glove box inner atmosphere of which had been adjusted to have low humidity and an oxygen concentration of 0.5%, and cover glass serving as a second substrate was placed onto the ultraviolet ray curable resin, followed by curing the ultraviolet ray curable resin by irradiation of ultraviolet rays to seal the power generation region, to thereby produce a photoelectric conversion element module 1 of the present disclosure illustrated in FIG. 7.

Note that, a layer thickness of the second electrode and a layer thickness of the hole-transporting layer were measured by means of a coherence scanning interference microscope (VS1500, available from Hitachi High-Tech Science Corporation). When the layer thickness of the second electrode was measured, part of the second electrode was peeled with a tape after forming the second electrode, and a field of view was adjusted in a manner that the hole-transporting layer that was one layer below the second electrode came into the same captured image with the second electrode. Then, an image of the second electrode was taken under the following conditions. When the layer thickness of the hole-transporting layer was measured, moreover, after forming the hole-transporting layer, tetrahydrofuran was dripped thereon to remove part of the hole-transporting layer, and a field of view was adjusted in a manner that the electron-transporting layer that was one layer below the hole-transporting layer came into the same captured image with the hole-transporting layer. Then, an image of the hole-transporting layer was taken under the following conditions. An average thickness of the measured layer and an average thickness of the layer below were calculated by an average step analysis.

[Measuring Conditions of Layer Thickness]
Measuring mode: WAVE mode
Magnification of objective lens: 2.5×
Wavelength filter: 530 nm White
Observation range: 1,900 pin×1,400 pin
Number of pixels: 640 pix×480 pix Moreover, Rc(50) was determined as follows.
A surface configuration of the hole-transporting layer was planar observed by means of a coherence scanning interference microscope (VS1500, available from Hitachi High-Tech Science Corporation) under the following conditions. Next, a total cross-sectional area of the projected parts having the height of X+50 (nm) or greater from the surface of the hole-transporting layer 6 that was opposite to the surface thereof in contact with the second electrode 7 was determined by particle analysis. The obtained total cross-sectional area was divided with the area of the observed region. Then, an average value of the values obtained from three fields of view was calculated to determine Rc(50).

[Measuring Conditions of Rc(50)]
Measuring mode: WAVE mode
Magnification of objective lens: 10×
Wavelength filter: 530 nm White
Observation range: 470 nm×350 nm
Number of pixels: 640 pix×480 pix <Evaluation of Photoelectric Conversion Element Module>
IV properties of the obtained photoelectric conversion element module 1 was evaluated under irradiation of which LED adjusted to 200 lux, which was low illuminance, by means of a DC voltage-current source/monitor (ADCMT, 6241A) to determine initial maximum output power Pmax (μW/cm$^2$). Subsequently, IV properties of the photoelectric conversion element module 1 was again evaluated with 200 lux after irradiating the photoelectric conversion element module 1 with white LED adjusted to 10,000 lux, which was high illuminance, continuously for 200 hours, to measure a maximum output power after the irradiation of high illuminance light. Then, a retention rate was determined. The results are presented in Table 1.

Example 2

Pmax and the retention rate were determined in the same manner as in Example 1, except that the average thickness of the hole-transporting layer was changed to about 500 nm. The results are presented in Table 1.

Example 3

Pmax and the retention rate were determined in the same manner as in Example 1, except that the average thickness of the hole-transporting layer was changed to about 600 nm. The results are presented in Table 1.

Example 4

Pmax and the retention rate were determined in the same manner as in Example 1, except that the average thickness of the hole-transporting layer was changed to about 800 nm. The results are presented in Table 1.

Example 5

Pmax and the retention rate were determined in the same manner as in Example 2, except that a second electrode having the average thickness of about 20 nm was formed. The results are presented in Table 1.

Example 6

Pmax and the retention rate were determined in the same manner as in Example 5, except that the average thickness of the second electrode was changed to about 45 nm. The results are presented in Table 1.

Example 7

Pmax and the retention rate were determined in the same manner as in Example 5, except that the average thickness of the second electrode was changed to about 30 nm. The results are presented in Table 1.

Comparative Example 1

Pmax and the retention rate were determined in the same manner as in Example 1, except that a hole-transporting layer having a thickness of about 300 nm was formed with a hole-transporting layer coating liquid through spin coating, and a second electrode having the average thickness of about 100 nm was formed by depositing silver on the hole-transporting layer through vacuum vapor deposition. The results are presented in Table 1.

Comparative Example 2

Pmax and the retention rate were determined in the same manner as in Comparative Example 1, except that the average thickness of the hole-transporting layer was changed to about 500 nm and the average thickness of the second electrode was changed to about 60 nm. The results are presented in Table 1.

Comparative Example 3

Pmax and the retention rate were determined in the same manner as in Comparative Example 2, except that the average thickness of the second electrode was changed to about 20 nm. The results are presented in Table 1.

TABLE 1

| | Coating method of hole-transporting layer | Thickness of each layer (nm) | | Ratio of area of projected parts of 50 nm or greater on surface of hole-transporting layer Rc (%) | Initial maximum output power Pmax (uW/cm$^2$) | Pmax retention rate (%) after continuous irradiation |
| --- | --- | --- | --- | --- | --- | --- |
| | | hole-transporting layer | second electrode | | | |
| Ex. 1 | blade coating | 400 | 60 | 0.70 | 10.2 | 81 |
| Ex. 2 | blade coating | 500 | 60 | 0.55 | 9.7 | 85 |
| Ex. 3 | blade coating | 600 | 60 | 0.45 | 10.8 | 92 |
| Ex. 4 | blade coating | 800 | 60 | 0.12 | 11.2 | 94 |
| Ex. 5 | blade coating | 500 | 20 | 0.55 | 9.1 | 80 |
| Ex. 6 | blade coating | 500 | 45 | 0.55 | 9.8 | 86 |
| Ex. 7 | blade coating | 500 | 30 | 0.55 | 9.4 | 86 |
| Comp. Ex. 1 | spin coating | 300 | 100 | 2.1 | 7.3 | 75 |
| Comp. Ex. 2 | spin coating | 500 | 60 | 1.5 | 6.5 | 63 |
| Comp. Ex. 3 | spin coating | 500 | 20 | 1.2 | output failure | — |

It was found from the results of Table 1 that the retention rate was 80% or greater in Examples 1 to 7, and the reduction in output with low illuminance light before and after being exposed to high illuminance light could be suppressed compared with Comparative Examples 1 to 3. Moreover, it was found by comparing Example 5 with Example 7 that Pmax and the retention rate of Pmax after the continuous irradiation were low when the layer thickness of the second electrode was 25 nm or less even through Rc(50) was 0.75% or less, and therefore the layer thickness of the second electrode was important in addition to Rc(50). Furthermore, it was clear from the comparison between Examples 1 to 4 that the higher Pmax and retention rate of Pmax after the continuous irradiation were obtained when the layer thickness of the second electrode was 50 nm or greater.

As described above, the photoelectric conversion element of the present disclosure satisfies the following formula 0%<Rc(50)≤0.75%, where Rc(50) is a ratio of an area of the projected parts having height of 50 nm or greater relative to a unit area of the surface of the hole-transporting layer at the side of the second electrode. As a result, there are less places where the second electrode is thin, and therefore the photoelectric conversion element of the present disclosure is unlikely to cause electric current leakage, and the photosensitizing compound therein is not easily damaged, and therefore a reduction in output with low illuminance light before and after being exposed to high illuminance light can be suppressed. Accordingly, the photoelectric conversion element of the present disclosure can have high power generation output with light of lighting equipment used indoor, such as LED and a fluorescent lamp, even after being exposed to sun light.

For example, embodiments of the present disclosure are as follows.

<1> A photoelectric conversion element including:
a first electrode;
an electron-transporting layer;
a hole-transporting layer; and
a second electrode,
wherein the hole-transporting layer and the second electrode are in contact with each other, and
the hole-transporting layer satisfies the following formula:

$$0\% < Rc(50) \le 0.75\%$$

where an average thickness of the hole-transporting layer is determined as X (nm), and Rc(50) is a ratio of an area of projected parts that are projected from a standard line towards the second electrode, where the standard line is present at a position that is away, by X+50 (nm), from an opposite surface of the hole-transporting layer to a surface of the hole-transporting layer in contact with the second electrode.

<2> The photoelectric conversion element according to <1>, wherein the hole-transporting layer satisfies the following formula:

$$0\% < Rc(50) \le 0.50\%.$$

<3> The photoelectric conversion element according to <1> or <2>, wherein an average thickness of the second electrode is 25 nm or greater.

<4> The photoelectric conversion element according to any one of <1> to <3>,
wherein an average thickness of the second electrode is 50 nm or greater.

<5> A photoelectric conversion element module including:
a plurality of photoelectric conversion elements disposed in the photoelectric conversion element module, each of the photoelectric conversion elements being the photoelectric conversion element according to any one of <1> to <4>.

<6> An electronic device including:
the photoelectric conversion element according to any one of <1> to <4> and/or the photoelectric conversion element module according to <5>; and
a device configured to be driven by electric power generated by photoelectric conversion performed by the photoelectric conversion element and/or the photoelectric conversion element module.

<7> A power supply module including:
the photoelectric conversion element according to any one of <1> to <4> and/or the photoelectric conversion element module according to <5>; and a power supply IC.

The photoelectric conversion element according to any one of <1> to <4>, the photoelectric conversion element module according to <5>, the electronic device according to <6>, and the power supply module according to <7> can solve the above-mentioned various problems existing in the art and can achieve the object of the present disclosure.

What is claimed is:

1. A photoelectric conversion element, comprising:
a first electrode;
an electron-transporting layer;
a hole-transporting layer; and
a second electrode having an average thickness in a range of from 20 to 300 nm,
wherein the hole-transporting layer and the second electrode are in contact with each other, and
wherein the hole-transporting layer satisfies a formula (1):

$$0\% < Rc(50) \le 0.75\% \tag{1}$$

wherein an average thickness of the hole-transporting layer is X (nm), and Rc(50) is a ratio of an area of projected parts that are projected from a standard line towards the second electrode, of formula (2):

$$Rc(50) = X/(X+50) \tag{2},$$

wherein the standard line is present at a position that is away, by X+50 (u n), from an opposite surface of the hole-transporting layer to a surface of the hole-transporting layer in contact with the second electrode.

2. The element of claim 1, wherein the hole-transporting layer satisfies a formula:

$$0\% < Rc(50) \le 0.50\%.$$

3. The element of claim 1, wherein the second electrode has an average thickness in a range of from 25 nm to 300 nm.

4. The element of claim 1, wherein the second electrode has an average thickness in a range of from 50 nm to 300 nm.

5. A photoelectric conversion element module, comprising:
a plurality of photoelectric conversion elements disposed in the photoelectric conversion element module, each of the photoelectric conversion elements being the element of claim 1.

6. An electronic device, comprising:
the element of claim 1; and
a device configured to be driven by electric power generated by photoelectric conversion performed by the photoelectric conversion element.

7. A power supply module, comprising:
the element of claim 1; and
a power supply IC.

8. The element of claim 1, wherein the second electrode has an average thickness in a range of from 20 to less than 100 nm.

9. The element of claim 1, wherein the second electrode has an average thickness in a range of from 20 to 60 nm.

10. The element of claim 1, wherein the hole-transporting layer has a thickness in a range of from 400 to 800 nm.

11. The element of claim 1, wherein $$0.12\% < Rc(50) \le 0.70\%.$$

12. The element of claim 1, wherein $$0.45\% < Rc(50) \le 0.55\%.$$

13. The element of claim 1, wherein $$0.12\% < Rc(50) \le 0.45\%.$$

14. The element of claim 10, wherein $$0.12\% < Rc(50) \le 0.70\%.$$

15. The element of claim 1, further comprising a hole-blocking layer, wherein the hole-blocking layer has a thickness in a range of from 5 to 30 nm.

16. The element of claim 15, wherein the electron-transporting layer comprises a porous metal oxide semiconductor contacting the hole-transporting layer.

17. The element of claim 15, wherein the electron-transporting layer comprises a semiconductor having a rough surface contacting the hole-transporting layer.

18. The element of claim 1, wherein the electron-transporting layer comprises a photosensitizing compound of formula (3):

(3)

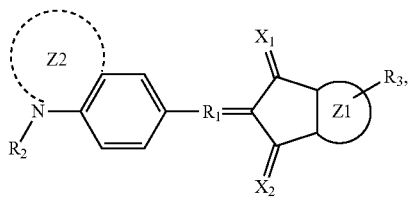

wherein
X$_1$ and X$_7$ are independently O, S, or Se,
R$_1$ is an optionally substituted methine group,
R$_2$ is an optionally substituted alkyl group, and
Z$_1$ and Z$_2$ are independently a substituent suitable to form a ring structure.

19. The element of claim 1, wherein the hole-transporting layer comprises a basic compound of formula (4a), (4b), and/or (4c):

(4a)
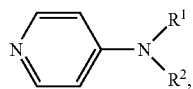

(4b)
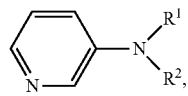

(4c)
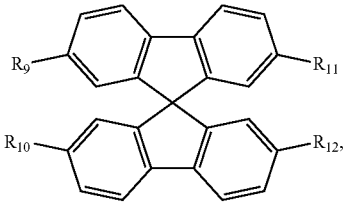

wherein R$_1$ and R$_2$ are each independently an alkyl group or an aromatic hydrocarbon group, or R$_1$ and R$_2$ are bonded to each other to form a heterocyclic group, and wherein R$_9$ to R$_{12}$ are independently a substituted amino group.

20. The element of claim 1, wherein the hole-transporting layer comprises a metal complex comprising a Co, Fe, Ni, and/or Cu cation.

* * * * *